US012034076B2

United States Patent
Chen et al.

(10) Patent No.: US 12,034,076 B2
(45) Date of Patent: Jul. 9, 2024

(54) SEMICONDUCTOR DEVICE INTEGRATING BACKSIDE POWER GRID AND RELATED INTEGRATED CIRCUIT AND FABRICATION METHOD

(71) Applicant: TAIWAN SEMICONDUCTOR MANUFACTURING COMPANY LTD., Hsinchu (TW)

(72) Inventors: Chih-Liang Chen, Hsinchu (TW); Lei-Chun Chou, Taipei (TW); Jack Liu, Taipei (TW); Kam-Tou Sio, Hsinchu County (TW); Hui-Ting Yang, Hsinchu County (TW); Wei-Cheng Lin, Taichung (TW); Chun-Hung Liou, Hsinchu (TW); Jiann-Tyng Tzeng, Hsinchu (TW); Chew-Yuen Young, Cupertino, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 364 days.

(21) Appl. No.: 17/406,884

(22) Filed: Aug. 19, 2021

(65) Prior Publication Data

US 2021/0384351 A1 Dec. 9, 2021

Related U.S. Application Data

(60) Continuation of application No. 16/894,228, filed on Jun. 5, 2020, now Pat. No. 11,121,256, which is a
(Continued)

(51) Int. Cl.
*H01L 29/78* (2006.01)
*H01L 21/768* (2006.01)
(Continued)

(52) U.S. Cl.
CPC .... *H01L 29/7851* (2013.01); *H01L 21/76871* (2013.01); *H01L 21/823431* (2013.01);
(Continued)

(58) Field of Classification Search
CPC ............... H01L 21/43; H01L 21/76871; H01L 21/76895; H01L 21/823431;
(Continued)

(56) References Cited

U.S. PATENT DOCUMENTS

2007/0012945 A1    1/2007  Sugizaki
2017/0358592 A1   12/2017  Yamaguchi
2018/0145030 A1*   5/2018  Beyne ................. H01L 23/5283

FOREIGN PATENT DOCUMENTS

TW            201724300 A        7/2017

OTHER PUBLICATIONS

Office Action, Cited References and Search Report dated Feb. 23, 2023 issued by the Taiwan Intellectual Property Office for the Taiwan Counterpart Application No. 111117026.
(Continued)

*Primary Examiner* — Fazli Erdem
(74) *Attorney, Agent, or Firm* — WPAT LAW; Anthony King

(57) ABSTRACT

A semiconductor device includes a substrate, a dielectric region, a first fin structure, a second fin structure, a plurality of conductive regions, a first conductive rail and a conductive structure. The dielectric region is situated on the substrate. The first fin structure protrudes from the substrate and the dielectric region. The second fin structure protrudes from the substrate and the dielectric region, and extends parallel to the first fin structure. The conductive regions are situated on the dielectric region. The first conductive rail is situated within the dielectric region, and electrically connected to a first conductive region of the plurality of conductive regions.
(Continued)

Opposite sides of the first conductive rail face the first fin structure and the second fin structure, respectively. The conductive structure penetrates through the substrate and formed under the first conductive rail, and is electrically connected to the first conductive rail.

20 Claims, 19 Drawing Sheets

Related U.S. Application Data division of application No. 15/993,149, filed on May 30, 2018, now Pat. No. 10,700,207.

(60) Provisional application No. 62/592,744, filed on Nov. 30, 2017, provisional application No. 62/592,922, filed on Nov. 30, 2017.

(51) Int. Cl.
  *H01L 21/8234* (2006.01)
  *H01L 23/48* (2006.01)
  *H01L 23/528* (2006.01)
  *H01L 23/535* (2006.01)
  *H01L 27/088* (2006.01)
  *H01L 29/417* (2006.01)
  *H01L 29/66* (2006.01)

(52) U.S. Cl.
  CPC .... *H01L 21/823475* (2013.01); *H01L 23/481* (2013.01); *H01L 23/528* (2013.01); *H01L 23/5286* (2013.01); *H01L 23/535* (2013.01); *H01L 27/0886* (2013.01); *H01L 29/66795* (2013.01); *H01L 29/41791* (2013.01)

(58) Field of Classification Search
  CPC ........... H01L 21/823475; H01L 23/481; H01L 23/485; H01L 23/528; H01L 23/5236; H01L 23/535; H01L 27/0886; H01L 29/41791; H01L 29/66795; H01L 29/7845; H01L 29/7848; H01L 29/7851
  USPC .......................................................... 257/401
  See application file for complete search history.

(56) References Cited

OTHER PUBLICATIONS

English Abstract of TW201724300A.

* cited by examiner

SEMICONDUCTOR DEVICE INTEGRATING BACKSIDE POWER GRID AND RELATED INTEGRATED CIRCUIT AND FABRICATION METHOD

PRIORITY CLAIM AND CROSS-REFERENCE

The present application is a continuation application of U.S. patent application Ser. No. 16/894,228 filed on Jun. 5, 2020, which is a divisional application of U.S. patent application Ser. No. 15/993,149 filed on May 30, 2018, which claims the benefit of U.S. Provisional Patent Appl. No. 62/592,744, filed on Nov. 30, 2017, and U.S. Provisional Patent Appl. No. 62/592,922, filed on Nov. 30, 2017, each of which is incorporated herein by reference in its entirety.

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (e.g. the number of interconnected devices per chip area) has generally increased while geometry size (e.g. the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
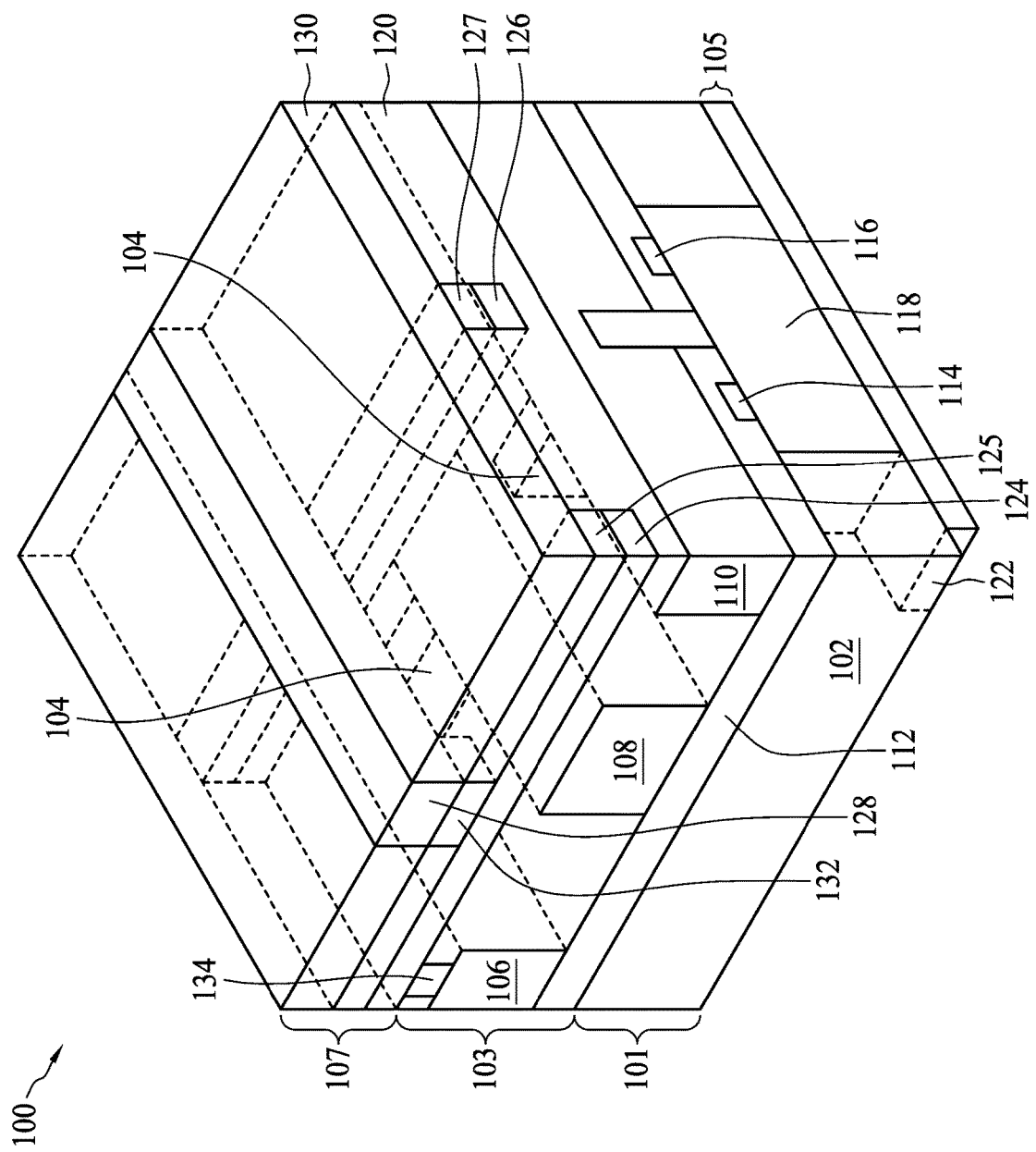
FIG. 1A illustrates an isometric view of an exemplary semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure describes exemplary semiconductor devices, such as fin field-effect transistors (finFETs), having one or more conductive rails which may be situated on a semiconductor substrate and electrically connected to one or more conductive structures penetrating through the semiconductor substrate, and describes exemplary methods for fabricating these semiconductor devices. In some situations, the one or more conductive rails may be electrically connected to source regions, gate regions and/or drain regions of these semiconductor devices, and the one or more conductive rails may be utilized to connect the source regions, gate regions and/or drain regions of these semiconductor devices to one or more power grids situated under the semiconductor substrate through the one or more conductive structures. In some situations, one or more first metal wires each extending in a first direction may be situated above and electrically connected to the source regions, gate regions and/or drain regions of these semiconductor devices, and one or more second metal wires each extending in a second direction different from the first direction may be situated above the one or more first metal wires and electrically connected to the one or more first metal wires through one or more conductive through vias such as one or more self-aligned vias.

FIG. 1A illustrates an isometric view of an exemplary semiconductor device according to an embodiment of the present disclosure. In the embodiment shown in FIG. 1A, the semiconductor device 100 includes a substrate structure layer 101, a transistor structure layer 103, a backside structure layer 105 and a conductive interconnect structure layer 107 disposed one over another.

In the present embodiment, the substrate structure layer 101 includes a substrate 102 and a conductive structure 118 penetrating through the substrate 102 to provide electrical connection between a first side and a second side, opposite the first side, of the substrate 102. For illustration purposes, the first side of the substrate 102, on which the transistor structure layer 103 is formed, is referred to herein as a front side of the substrate 102 or a front side of the semiconductor device 100; the second side of the substrate 102, on which the backside structure layer 105 is disposed, is referred to herein as a backside of the substrate 102 or a backside of the semiconductor device 100.

As to be described in more detail below, a portion of the substrate 102 can be removed through a patterning process, such as a dry etch or a wet etch, during fabrication to expose the transistor structure layer 103. Thereafter, a conductive material can fill the portion of the substrate 102 to form the conductive structure 118. In some embodiments, the conductive structure 118 can include a conductive through-substrate via such as a through-silicon via (TSV) and/or a trench-type through-substrate via (e.g. a through-silicon trench (TST)).

In the embodiment illustrated in FIG. 1A, the transistor structure layer 103, disposed on the substrate structure layer 101, includes a fin structure 104, a plurality of conductive regions, a dielectric region 112, and a plurality of conductive rails 114 and 116. In some situations, the conductive regions may comprise a plurality of terminal regions such as a source region 106, a gate region 108 and a drain region 110. The fin structure 104, the source region 106, the gate region 108 and the drain region 110 may be configured to form a fin field-effect transistor (finFET). However, those skilled in the relevant art will recognize the finFET can include other regions, such as a dielectric region (or an isolation region) 120 to provide some examples, without departing from the spirit and scope of the present disclosure. In addition, the configuration and arrangements of the fin structure 104, the source region 106, the gate region 108, and the drain region 110 as illustrated in FIG. 1A are for illustrative purposes only. Those skilled in the relevant art will recognize other configuration and arrangements for the fin structure 104, the source region 106, the gate region 108, and the drain region 110 are possible without departing from the spirit and scope of the present disclosure.

For illustrative purposes, the description that follows describes the semiconductor device 100 in terms of a finFET. Those skilled in the relevant art will recognize the semiconductor device 100 can be other non-planar semiconductor devices as well as planar semiconductor devices without departing from the spirit and scope of the present disclosure.

As illustrated in FIG. 1A, the fin structure 104, the source region 106, the gate region 108, the drain region 110, the dielectric region 112 (also referred to as an interlayer dielectric (ILD) region), and the conductive rails 114 and 116 are situated on the substrate 102. The fin structure 104 protrudes from the substrate 102 and the dielectric region 112, and passes through the gate region 108 between the source region 106 and the drain region 110. Although the finFET shown in FIG. 1A includes one fin structure 104, those skilled in the relevant art will recognize the finFET can include more than one fin structure without departing from the spirit and scope of the present disclosure.

The source region 106, the gate region 108, and the drain region 110 are situated on the dielectric region 112 with the fin structure 104 traversing through the dielectric region 112 onto the semiconductor substrate 102. Although not illustrated in FIG. 1A, other dielectric regions can be situated between the semiconductor substrate 102 and the dielectric region 112 as will be recognized by those skilled in the relevant art without departing from the spirit and scope of the present disclosure.

The conductive rails 114 and 116 are situated within the dielectric region 112, and traverse the semiconductor substrate 102 between the source region 106 and the drain region 110. The conductive rail 114 faces a first sidewall of the fin structure 104, and the conductive rail 116 faces a second sidewall of the fin structure 104. In some situations, the conductive rails 114 and 116 are situated to be parallel to the fin structure 104. However, those skilled in the relevant art will recognize the conductive rails 114 and 116 can be situated to be perpendicular to the fin structure 104 without departing from the spirit and scope of the present disclosure. In this situation, the conductive rails 114 and 116 traverse through the fin structure 104. Additionally, the number of conductive rails can differ depending upon application without departing from the spirit and scope of the present disclosure. For example, in some situations, the semiconductor device 100 may have one or more than two conductive rails.

Figure 1B:
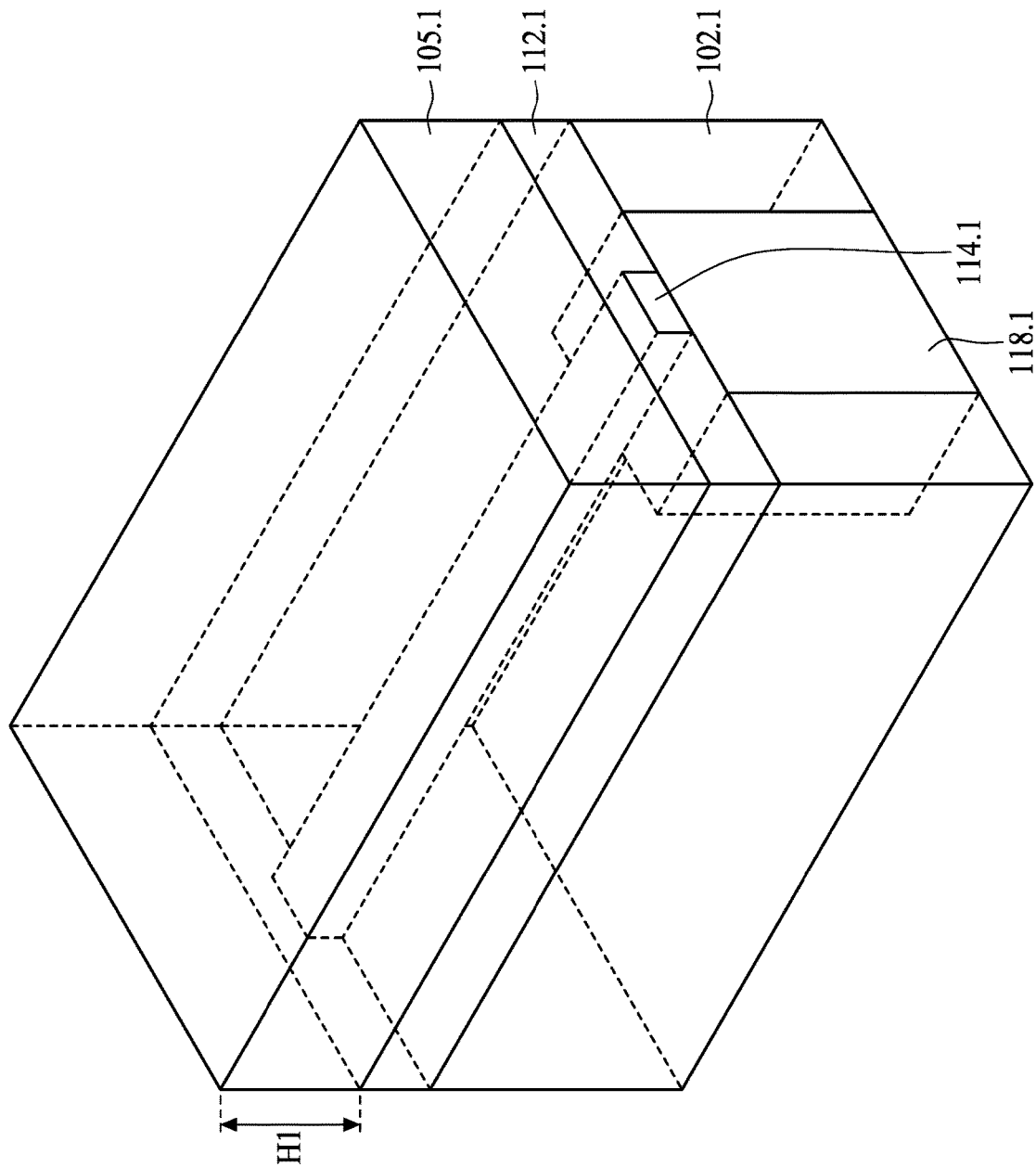
FIG. 1B illustrates an isometric view of a first configuration and arrangement of a dielectric region within an exemplary semiconductor device in accordance with some embodiments.

In some embodiments, the dielectric region 112 can be arranged to isolate the source region 106, the gate region 108, and/or the drain region 110 from the conductive rail 114/116 to prevent electrical connection between the source region 106, the gate region 108, and/or the drain region 110 and the conductive rail 114/116. Refer to FIG. 1B, which illustrates an isometric view of a first configuration of a dielectric region within an exemplary semiconductor device according to an exemplary embodiment of the present disclosure. A conductive rail 114.1 and a dielectric region 112.1 as illustrated in FIG. 1B can represent exemplary embodiments of the conductive rails 114/116 and the dielectric region 112 as described above in FIG. 1A respectively. A conductive region 105.1 as illustrated in FIG. 1B can represent an exemplary embodiment of the source region 106, the gate region 108, and/or and the drain region 110 as described above in FIG. 1A. A substrate 102.1 and a conductive structure 118.1 as illustrated in FIG. 1B can represent an exemplary embodiment of the substrate 102 and the conductive structure 118 as described above in FIG. 1A. In the exemplary embodiment illustrated in FIG. 113, the dielectric region 112.1 is arranged to prevent electrical connection between the conductive rail 114.1 and the conductive region 105.1.

Figure 1C:
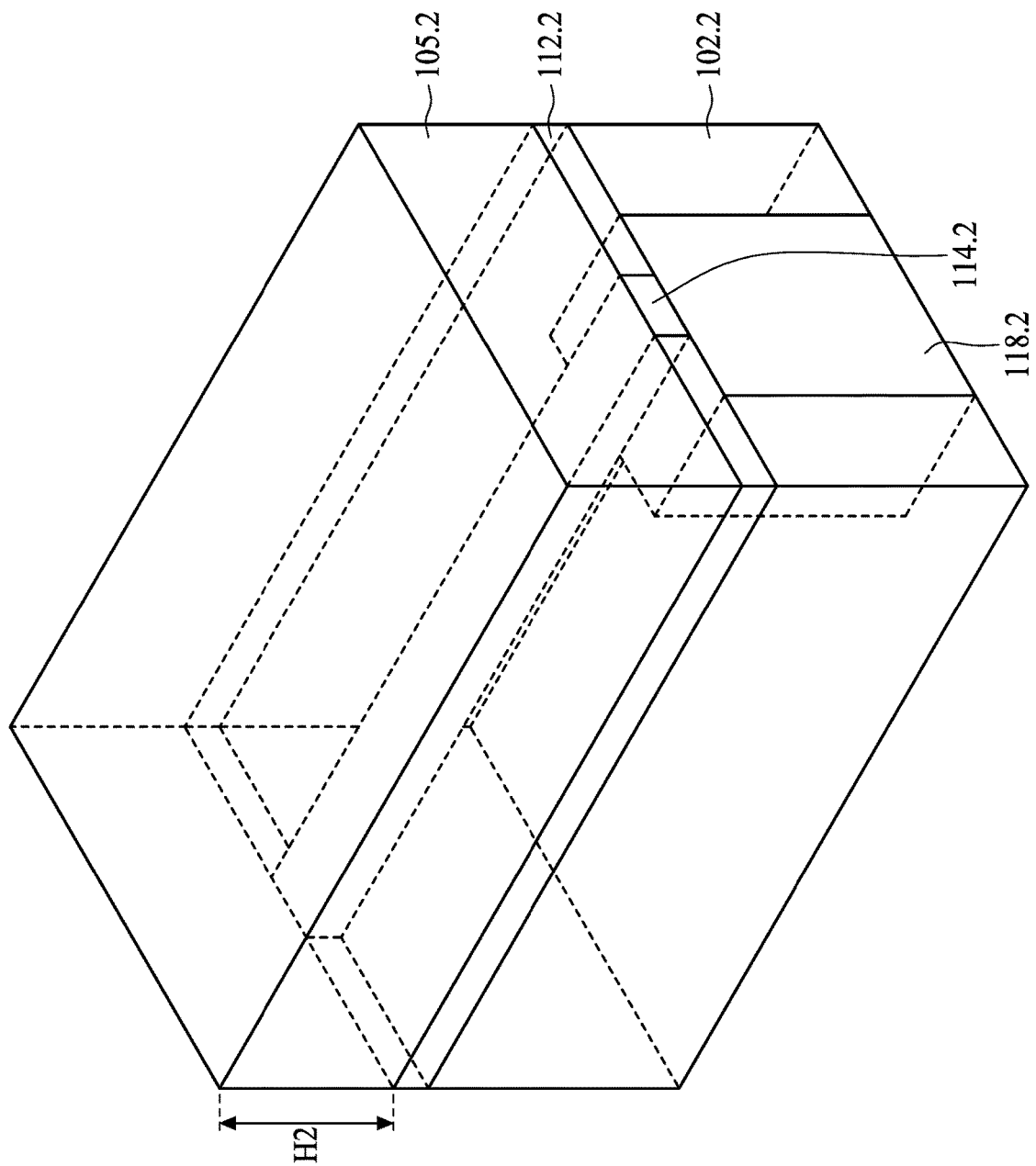
FIG. 1C illustrates an isometric view of a second configuration and arrangement of a dielectric region within an exemplary semiconductor device in accordance with some embodiments.

In some embodiments, the source region 106, the gate region 108, and/or the drain region 110 illustrated in FIG. 1A can be electrically connected to the conductive rail 114/116 to provide electrical connection between the source region 106, the gate region 108, and/or the drain region 110 and the conductive rail 114/116. Refer to FIG. 1C, which illustrates an isometric view of a second configuration of a dielectric region within an exemplary semiconductor device according to an exemplary embodiment of the present disclosure. A conductive rail 114.2 and a dielectric region 112.2 as illustrated in FIG. 1C can represent exemplary embodiments of the conductive rails 114/116 and the dielectric region 112 as described above in FIG. 1A respectively. A conductive region 105.2 as illustrated in FIG. 1C can represent an exemplary embodiment of the source region 106, the gate region 108, and/or and the drain region 110 as described above in FIG. 1A. A substrate 102.2 and a conductive structure 118.2 as illustrated in FIG. 1C can represent an exemplary embodiment of the substrate 102 and the conductive structure 118 as described above in FIG. 1A. In the exemplary embodiment illustrated in FIG. 1C, the conductive rail 114.2 can be electrically connected to the conductive region 105.2 to provide electrical connection between the conductive rail 114.2 and the conductive region 105.2. The conductive rail 114.2 is sufficiently exposed within the dielectric region 112.2 to electrically connect to the conductive region 105.2 to provide the electrical connection.

As to be described in more detail below, a portion of the dielectric region 112.2 can be removed through a patterning process, such as a dry etch or a wet etch to provide some examples, during fabrication to expose the portion of the dielectric region 112.2. Thereafter, the conductive region 105.2 can be deposited onto the portion of the dielectric region 112.2 through deposition where material is grown, coated, or otherwise transferred. In an exemplary embodiment, a height of the conductive region 105.2 as illustrated in FIG. 1C (labeled H2) can be greater than a height of the conductive region 105.1 as illustrated in FIG. 1B (labeled H1). In this exemplary embodiment, this difference in height between the conductive region 105.1 and the conductive region 105.2 results from removing sufficient portions of the dielectric region 112.2 to expose the conductive rail 114.2 to allow the electrical connection between the conductive rail 114.2 and the conductive region 105.2.

Referring to FIG. 1A again, at least one of the conductive rails 114 and 116 can be electrically and/or mechanically connected to other conductive rails of one or more other finFETs to form an interconnected network of conductive rails. This interconnected network of conductive rails can be used to electrically connect various gate, source, and/or drain regions of these finFETs to form one or more integrated circuits. These integrated circuits can include basic logical gates, such as logical AND gates, logical OR gates, logical XOR gates, logical XNOR gates, or logical NOT gates to provide some examples, as well as other more complicated logical circuitry as will be apparent to those skilled in the relevant art without departing from the spirit and scope of the present disclosure. This interconnected network of conductive rails allows these electrically connections between the various gate, source, and/or drain regions of these finFETs to be made without traversing through conventional metal layers which are conventionally available for routing signals. As such, the interconnected network of conductive rails lessens the area in terms of real estate necessary to form the one or more integrated circuits when compared to using the conventional metal layers to form these electrically connections between the various source regions and/or drain regions of these finFETs.

In some embodiments, a portion of the substrate 102 can be removed through a patterning process, such as a dry etch or a wet etch to provide some examples, during fabrication to expose the conductive rails 114 and 116. Thereafter, a conductive material can fill the portion of the substrate 102 to form the conductive structure 118. As the conductive rail 114/116 has a sufficient length (e.g. along a direction parallel to the fin structure 104), the conductive structure 118 can easily be aligned with the conductive rail 114/116. In some embodiments, the conductive structure 118 can also be formed under the fin structure 104 such that the fin structure 104 contacts the conductive structure 118.

In the embodiment illustrated in FIG. 1A, the backside structure layer 105, disposed below the substrate structure layer 101, includes a conductor 122. The conductor 122 is situated on the backside of the substrate 102, and electrically connected to the conductive structure 118. In some embodiments, the conductive structure 118 in the substrate structure layer 101, formed under the conductive rails 114 and 116 in the transistor structure layer 103, can be electrically connected to at least one of the conductive rails 114 and 116 to provide electrical connection between the front side and the backside of the substrate 102. Hence, the conductive structure 118 can provide electrical connection between the conductor 122, situated on the backside of the substrate 102, and the conductive rails 114 and 116, situated on the front side of the substrate 102. In some embodiments, the conductor 122 can be a power grid conductor arranged to transmit power for the semiconductor device 100. As such, the semiconductor device 100 can be powered by a backside power, thereby saving an amount of routing resources used on the front side of the semiconductor device 100.

In the exemplary embodiment illustrated in FIG. 1A, the conductive interconnect structure layer 107 can include a back-end-of-line (BEOL) interconnect structure formed on the front side of the semiconductor device 100. The conductive interconnect structure layer 107 may include a plurality of metal wires 124, 126 and 128, and a plurality of dielectric layers 125, 127 and 130. The metal wires 124 and 126 are situated in the dielectric region (or an isolation region) 120 and extend in a first direction, and the metal wire 128 is situated in the dielectric layer 130 and extends in a second direction different from the first direction. By way of example but not limitation, the first direction in which the metal wire 124 extends can be parallel to the fin structure 104, and can be perpendicular to the second direction in which the metal wire 128 extends. However, those skilled in the relevant art will recognize the metal wire 124 can extend in a direction perpendicular to the fin structure 104 without departing from the spirit and scope of the present disclosure.

The dielectric layers 125 and 127 are formed on the metal wires 124 and 126 respectively. In some situations, a conductive through via 132 can be formed in the dielectric layer 125 and aligned with the metal wire 124 to provide electrical connection between the metal wire 128 and the metal wire 124. By way of example but not limitation, the metal wire 124 can be formed by depositing conductive material(s) into a first trench of the dielectric region 120, and the dielectric layer 125 can be deposited over the metal wire 124 in the first trench. Next, the dielectric layer 130 is deposited over the dielectric region 120 and the dielectric layer 125, and a second trench is created by etching the dielectric layer 130. The second trench exposes a portion of the dielectric layer 125 and a portion of the dielectric region 120.

As the dielectric layer 125 and the dielectric region 120 can have different etch selectivities, the exposed portion of the dielectric region 120 would not be etched when the exposed portion of the dielectric layer 125 is etched. This means that the exposed portion of the dielectric layer 125 can be selectively etched. Hence, when the exposed portion of the dielectric layer 125 is selectively etched to expose a portion of the metal wire 124, the resulting via is self-aligned over the portion of the metal wire 124 because of the first and second trenches. Thereafter, the metal wire 128 and the conductive through via 132 are formed by depositing conductive material(s) into the resulting self-aligned via and the second trench of the dielectric layer 130. As such, the conductive through via 132, which is aligned with the metal wire 124, is located on the metal wire 124 and below the metal wire 128 to provide electrical connection between the metal wire 124 and the metal wire 128. Similarly, a conductive through via can be formed in the dielectric layer 127 and aligned with the metal wire 126 to provide electrical connection between the metal wire 126 and a metal wire formed above the dielectric layer 127.

In some embodiments, a distance between conductive paths within a semiconductor device decreases as the device size shrinks, resulting in an increased risk of dielectric breakdowns within the semiconductor device, such as time dependent dielectric breakdowns (TDDB). For example, consider a case where a distance between the metal wire 124 and the metal wire 126 is very short because of dimension shrinkage in the semiconductor device 100. When the conductive through via 132 is misaligned with the metal wire 124 and moves towards the metal wire 126, there would be voltage breakdowns between the conductive through via 132 and the metal wire 126 since a distance between the conductive through via 132 and the metal wire 126 fails to meet the misalignment tolerances. In contrast, as the conductive interconnect structure layer 107 can include metal wire(s) with self-aligned via(s), the risk of dielectric breakdowns in the semiconductor device 100 can be greatly reduced.

Additionally, in the embodiment as illustrated in FIG. 1A, the metal wire 124 is electrically connected to the source region 106 through a conductive through via 134. Hence, the source region 106 is electrically connected to the metal wire 128 through the self-aligned conductive through via 132. In some embodiments, the source region 106 electrically connected to the metal wire 128 may be further electrically connected to a conductive region (e.g. the gate region 108 or the drain region 110) through the conductive rail 114/116. In some embodiments, the source region 106 electrically connected to the metal wire 128 may be isolated from the conductive rail 114/116 by the dielectric region 120. However, those skilled in the relevant art will recognize that other conductive regions (e.g. a source region and/or a drain region) can be electrically connected to BEOL metal wire(s) without departing from the spirit and scope of the present disclosure. For example, in some embodiments, a conductive through via can be formed between the gate region 108 and the metal wire 124 such that the gate region 108 is electrically connected to the metal wire 128 through the conductive through via 132. In other embodiments, a conductive through via can be formed between the drain region 110 and the metal wire 124 such that the drain region 110 is electrically connected to the metal wire 128 through the conductive through via 132.

Figure 2A:
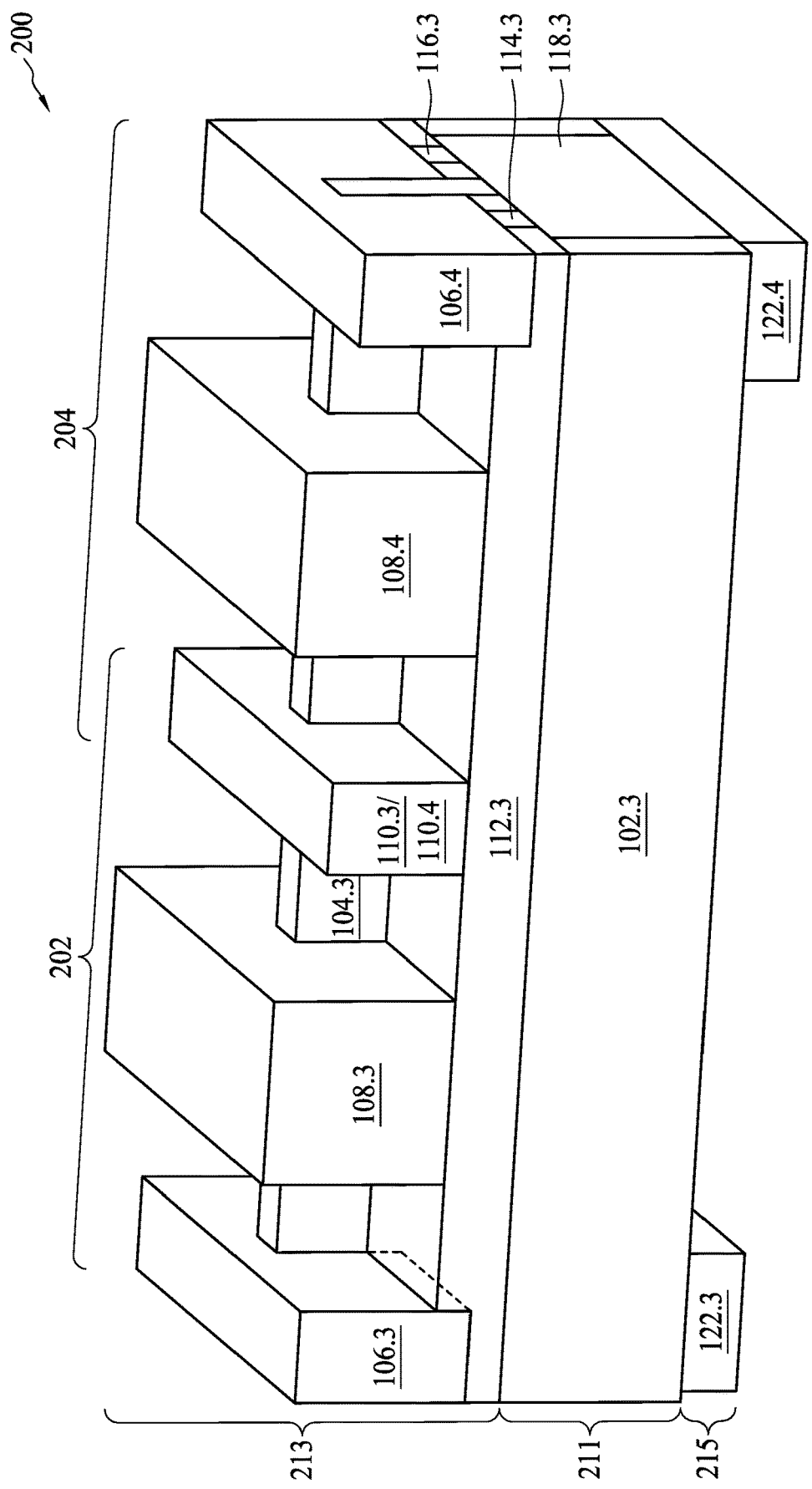
FIG. 2A and FIG. 2B illustrate isometric views of a first exemplary integrated circuit and a second exemplary integrated circuit, respectively, in accordance with some embodiments.

FIG. 2A illustrates an isometric view of a first exemplary integrated circuit according to some embodiments of the present disclosure. In the embodiment illustrated in FIG. 2A, a substrate structure layer 211, a transistor structure layer 213 and a backside structure layer 215 of the integrated circuit 200 can represent embodiments of the substrate structure layer 101, the transistor structure layer 103 and the backside structure layer 105 as described above in FIG. 1A.

The substrate structure layer 211 includes a substrate 102.3 and a conductive structure 118.3. The substrate 102.3 can represent embodiments of the substrate 102 shown in FIG. 1A, and the conductive structure 118.3 can represent embodiments of the conductive structure 118 shown in FIG. 1A.

The transistor structure layer 213 includes a finFET 202, a finFET 204, a dielectric region 112.3, a conductive rail 114.3 and a conductive rail 116.3. The finFETs 202 and 204 can represent exemplary embodiments of the finFET as described above in FIG. 1A. As such, a fin structure 104.3 can represent an embodiment of the fin structure 104 shown in FIG. 1A; a source region 106.3 of the finFET 202 and a source region 106.4 of the finFET 204 can represent exemplary embodiments of the source region 106 as described above in FIG. 1A; a gate region 108.3 of the finFET 202 and a gate region 108.4 of the finFET 204 can represent exemplary embodiments of the gate region 108 as described above in FIG. 1A; a drain region 110.3 of the finFET 202 and a drain region 110.4 of the finFET 204 can represent exemplary embodiments of the drain region 110 as described above in FIG. 1A. The drain region 110.3 and the drain region 110.4 can be characterized as being a common drain region which is shared between the finFET 202 and the finFET 204. Additionally, the dielectric region 112.3 can represent an embodiment of the dielectric region 112 shown in FIG. 1A. The conductive rails 114.3 and 116.3 can represent embodiments of the conductive rails 114 and 116 shown in FIG. 1A.

The finFETs 202 and 204 are situated onto the dielectric region 112.3, which has the conductive rails 114.3 and 116.3 situated within. The dielectric region 112.3 can be arranged to allow electrical connection between the conductive rails 114.3 and 116.3 and gate, source, and/or drain regions of the finFETs 202 and 204. In some embodiments, the dielectric region 112.3 can be arranged to prevent the electrical connection between the conductive rails 114.3 and 116.3 and gate, source, and/or drain regions of the finFETs 202 and 204.

In the present embodiment, the conductive rails 114.3 and 116.3 traverse a length of the semiconductor substrate 102.3 in a horizontal direction between the source region 106.3 and the source region 106.4. The conductive rail 114.3 can be electrically connected to the source region 106.3 to provide electrical connection between the source region 106.3 and the conductive rail 114.3 as described above in FIG. 1C, and can be electrically connected to the source region 106.4 to provide electrical connection between the source region 106.4 and the conductive rail 114.3 as described above in FIG. 1C. As such, the conductive rail 114.3 provides an electrical connection between the source region 106.3 and the source region 106.4. However, in the exemplary embodiment illustrated in FIG. 2A, the dielectric region 112.3 is arranged to prevent electrical connection between the conductive rail 116.3 and the source region 106.4 as described above in FIG. 1B. In this situation, the dielectric region 112.3 effectively isolates the conductive rail 116.3 from the source region 106.4 to prevent the electrical connection between the conductive rail 116.3 and the source region 106.4.

The backside structure layer 215 includes a conductor 122.3 and a conductor 122.4. The conductors 122.3 and 122.4 can represent embodiments of the conductor 122 shown in FIG. 1A. In the present embodiment, the conductive rails 114.3 and 116.3 are electrically connected to the conductor 122.4 through the conductive structure 118.3 penetrating the substrate 102.3. Similarly, the conductive rails 114.3 and 116.3 can be electrically connected to the conductor 122.3 through a conductive structure penetrating the substrate 102.3 (not shown in FIG. 2A). In some embodiments, at least one of the conductors 122.3 and 122.4 can be a backside metal pad or a power grid conductor.

The structure of the integrated circuit 200 as illustrated in FIG. 2A is for exemplary purposes only. Those skilled in the relevant art will recognize the integrated circuit 200 can include more finFETs arranged in a substantially similar manner as the finFET 202 and the finFET 204 without departing from the spirit and scope of the present disclosure. Additionally, or alternatively, in some embodiments, the integrated circuit 200 can further include a BEOL interconnect structure formed over the transistor structure layer 213, such as the BEOL interconnect structure in the conductive interconnect structure layer 107 as described in FIG. 1A.

Figure 2B:
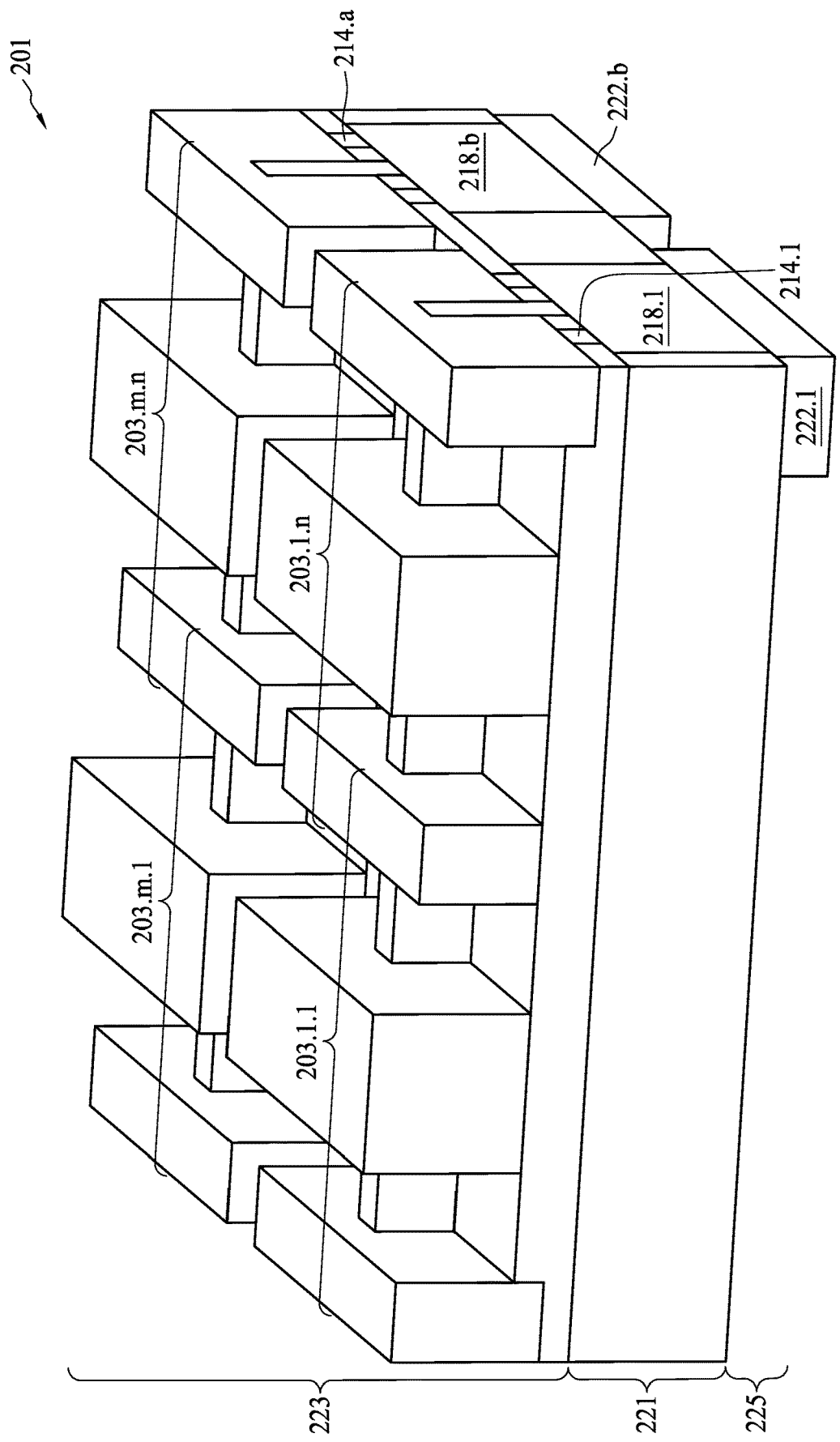

FIG. 2B illustrates an isometric view of a second exemplary integrated circuit according to some embodiments of the present disclosure. In the embodiment illustrated in FIG. 2B, a substrate structure layer 221, a transistor structure layer 223 and a backside structure layer 225 of the integrated circuit 201 can represent embodiments of the substrate structure layer 101, the transistor structure layer 103 and the backside structure layer 105 as described above in FIG. 1A.

As illustrated in FIG. 2B, the substrate structure layer 221 includes conductive structures 218.1-218.$b$, b being an integer greater than one. The conductive structures 218.1-218.$b$ can represent embodiments of the conductive structure 118 shown in FIG. 1A.

The transistor structure layer 223 includes finFETs 203.1.1-203.$m.n$ and one or more conductive rails 214.1-214.$a$, where n and m are integers greater than one, and a is a positive integer. The finFETs 203.1.1-203.$m.n$ can represent exemplary embodiments of the finFET as described above in FIG. 1A, and the one or more conductive rails 214.1-214.$a$ can represent exemplary embodiments of the conductive rails 114 and 116 shown in FIG. 1A. The finFETs 203.1.1-203.$m.n$ are arranged in an array of m rows and n columns. However, other arrangements for the finFETs 203.1.1-203.$m.n$ are possible without departing from the spirit and scope of the present disclosure. In this embodiment, each of the m rows includes one or more conductive rails from among the one or more conductive rails 214.1-214.$a$.

The backside structure layer 225 includes conductors 222.1-222.$b$, which can represent embodiments of the conductor 122 shown in FIG. 1A. In the present embodiment, the conductive structures 218.1-218.$b$ are electrically connected to one or more conductive rails from among the one or more conductive rails 214.1 through 214.$a$, and are electrically connected to the conductors 222.1-222.$b$ respectively.

FIGS. 3-12 illustrate isometric views of partially-fabricated semiconductor structures where conductive rail structures formed in interlayer dielectric materials can be used to provide electrical connection between multiple gate/source/drain terminals of finFET arrays and provide electrical connection between a front side BEOL interconnect structure and a backside power grid according to exemplary embodiments of the present disclosure. The description that follows can be used to fabricate a semiconductor device, such as the finFET as described above in FIG. 1A, and/or an integrated circuit having one or more semiconductor devices, such as the integrated circuit 200 as described above in FIG. 2A and/or the integrated circuit 201 as described above in FIG. 2B to provide some examples. U.S. Patent Application Publication Nos. 2005/0074960 and 2005/0074961, each incorporated herein by reference in their entireties, describe integration of interconnect isolation air gaps into a semiconductor structure.

Figure 3:
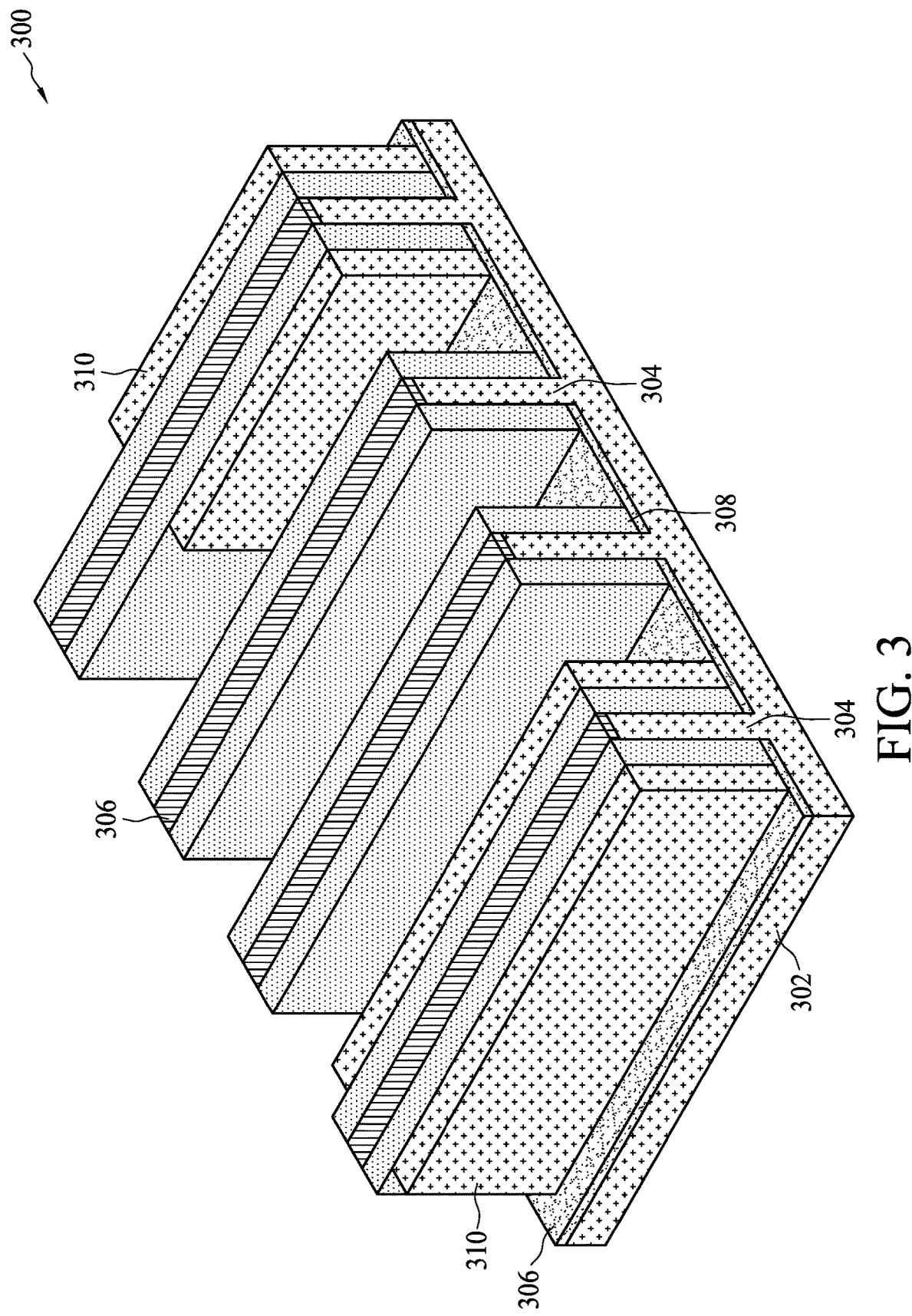
FIG. 3 is an isometric view of a partially-fabricated semiconductor structure in accordance with some embodiments.

FIG. 3 is an isometric view of a partially-fabricated semiconductor structure according to an exemplary embodiment of the present disclosure. A partially-fabricated semiconductor structure 300 includes portions of finFETs. As illustrated in FIG. 3, the partially-fabricated semiconductor structure 300 includes a substrate 302, fin structures 304, hard masks 306, dielectric spacers 308, and seed layer structures 310.

In the exemplary embodiment illustrated in FIG. 3, the substrate 302 can be a silicon substrate. However, those skilled in the relevant art will recognize the substrate 302 can alternatively be another semiconductor, a compound semiconductor, an alloy semiconductor or combinations thereof. In an exemplary embodiment, the substrate 302 can be a semiconductor on insulator (SOI). In an exemplary embodiment, the substrate 302 can be an epitaxial material.

As illustrated in FIG. 3, the fin structures 304 can include fin-shaped semiconductor material protruding from the substrate and can be in parallel with each other. The fin structures 304 include active regions where one or more transistors are formed. The fin structures 304 can include silicon, another elementary semiconductor, a compound semiconductor, an alloy semiconductor or combinations thereof. The fin structures 304 can be fabricated using suitable processes including patterning and etch processes. The patterning process can include forming a photoresist layer overlying the substrate (e.g., on a silicon layer), exposing the resist to a pattern, performing post-exposure bake processes, and developing the resist to form a masking element including the resist. The masking element can then be used to protect regions of the substrate while an etch process forms recesses into the substrate 302, leaving protruding fins. The recesses can be etched using a reactive ion etch (RIE) and/or other suitable processes. Numerous other methods to form the fin structures 304 on the substrate 302 may be suitable. For example, the fin structures 304 can include epitaxial material, in accordance with some embodiments.

The hard masks 306 can be used to pattern, such as by etching, the fin structures 304. The hard masks 306 can also be used protect the fin structures 304 during subsequent processing steps. In an exemplary embodiment, the hard masks 306 are formed on the top surfaces of the fin structures 304. The hard masks 306 can also be formed between the fin structures 304 and on top surfaces of the substrate 302. The hard masks 306 can made of a dielectric material, such as silicon nitride, silicon oxide, silicon carbide, silicon carbide nitride, titanium oxide, other suitable dielectric material, and/or combinations thereof. In an exemplary embodiment, the hard masks 306 are not formed on the top surface of the substrate 302 as illustrated in FIG. 3.

As illustrated in FIG. 3, the isolation spacers 308 can partially fill the recesses between the fin structures 304 and formed on the sidewalls of the fin structures 304. In an exemplary embodiment, the isolation spacers 308 can be made of a dielectric material such as, for example, silicon oxide, spin-on-glass, silicon nitride, silicon carbide, silicon carbon nitride, silicon oxynitride, fluorine-doped silicate glass (FSG), a low-k dielectric material, other suitable insulating material, and/or combinations thereof. In an exemplary embodiment, the isolation spacers 308 can be formed by blanket depositing an isolation material over the exposed surfaces and using an anisotropic etching process to remove horizontal portions of the deposited isolation layer. The isolation spacers 308 can be deposited by chemical vapor deposition (CND), plasma-enhanced CND (PECVD), physical vapor deposition (PVD), atomic layer deposition (ALD), other suitable processes, and/or combinations thereof. Other fabrication techniques for the isolation spacers 308 and/or the fin structures 304 are possible. The isolation spacers 308 can include a multi-layer structure such as, for example, a structure with one or more liner layers. The isolation spacers 308 can also be formed by depositing an enhanced spacer layer using multi-step deposition and treatment process to eliminate voids and seams in the spacer material. In an exemplary embodiment, the isolation spacers 308 can be interlayer dielectric material. In an exemplary embodiment, the isolation spacers 308 are formed directly on the substrate 302 and on the sidewalk of the fin structures 304.

As illustrated in FIG. 3, the seed layer structures 310 are formed on the sidewalls of isolation spacer 308. In an exemplary embodiment, the seed layer structures 310 can be formed of silicon material such as, for example, silicon, silicon compounds, titanium nitride (TiN), tungsten, cobalt, other suitable materials, and/or combinations thereof. In an exemplary embodiment, the seed layer structures 310 can have a different etch selectivity as the isolation spacers 308. In an exemplary embodiment, the seed layer structures 310 are formed directly on the substrate 302 and on the sidewalls of the isolation spacers 308. In an exemplary embodiment, the seed layer structures 310 can be formed by blanket depositing a semiconductor material over the exposed surfaces, patterning the deposited semiconductor material, and using an anisotropic etching process to remove exposed portions of the deposited seed layer material not protected by photoresists. In an exemplary embodiment, an exemplary patterning process can include forming a photoresist layer over the exposed surfaces of deposited seed layer material, exposing the resist to a mask or reticle having a pattern thereon, performing a post-exposure bake process, and developing the resist to form a masking layer. In an exemplary embodiment, the masking layer can be hard masks such as, for example, silicon nitride layers, other suitable layers, and/or combinations thereof. Surface areas of seed layer material that are not protected by the masking layer are etched using, for example, a reactive ion etching (RIE) processes, a wet etching process, other suitable processes, and/or combinations thereof. In an exemplary embodiment, the etching selectivity can be substantially different between seed layer material and other structures of partially-fabricated semiconductor structure 300 by controlling etching parameters of the etch process such as, for example, etchant gas type, gas flow rate, etching temperature, plasma power, chamber pressure, other suitable parameters, and/or combinations thereof. For example, the etch process can be an RIE process using fluorocarbon gases such as $CF_4$, fluoroform ($CHF_3$), octafluoropropane ($C_3F_8$), other suitable etchant gases, and/or combinations thereof. The etch process can be an anisotropic etch process. Other fabrication techniques for the seed layer structures 310 are possible. The seed layer structures 310 can include a multi-layer structure such as, for example, a structure with one or more liner layers. The length L of the seed layer structures 310, measured along the fin length, can vary based on device needs, for example, the length of subsequently formed metal drain channels. FIG. 3 illustrates the seed layer structures 310 with different lengths L. As illustrated in FIG. 3, top surfaces of the hard masks 306, the isolation spacers 308, and the seed layer structures 310 can be substantially coplanar by performing suitable planarization processes on the top surfaces of these structures. The planarization process can be, for example, a chemical mechanical polishing (CMP) process.

Figure 4:
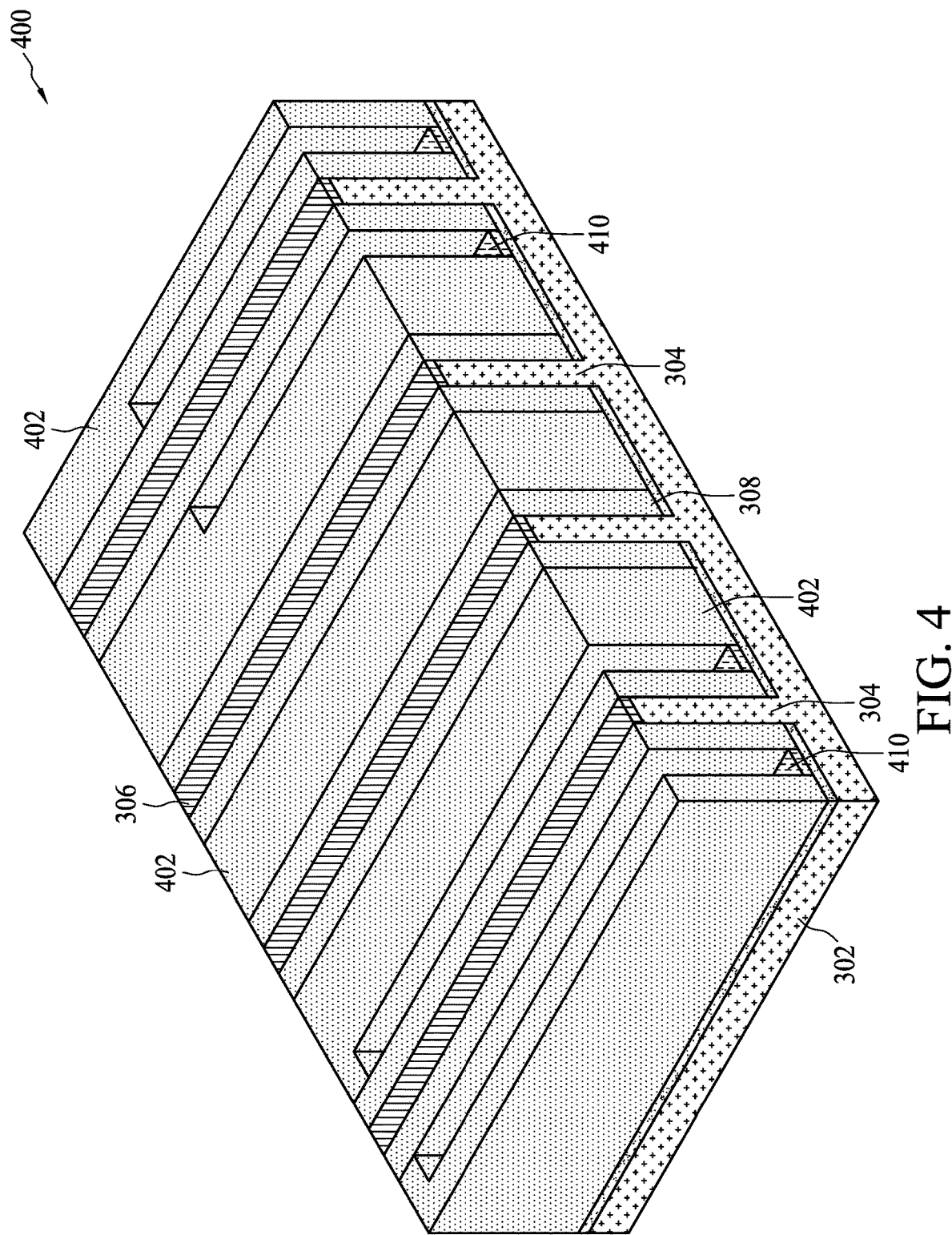
FIG. 4 is an isometric view of a partially-fabricated semiconductor structure after gap fill is formed in openings and seed layer structures are partially removed in accordance with some embodiments.

FIG. 4 is an isometric view of a partially-fabricated semiconductor structure after gap fill is formed in openings and seed layer structures are partially removed according to an exemplary embodiment of the present disclosure. Partially-fabricated semiconductor structure 400 includes the substrate 302, the fin structures 304, the hard masks 306, the dielectric spacers 308, seed layer structures 410, and gap fill structures 402.

As illustrated in FIG. 4, the gap fill structures 402 can fill the openings in the partially-fabricated semiconductor structure 300 as described in FIG. 3 above. The gap fill structures 402 can fill the openings formed between any adjacent structures such as, for example, between adjacent fin structures 304, between opposing fin structures 304 and the seed layer structures 310, between opposing the seed layer structures 310, and/or other openings between structures. In an exemplary embodiment, the gap fill structures 402 can be made of a dielectric material similar to the isolation spacers 308, such as, for example, silicon oxide, spin-on-glass, silicon nitride, silicon carbide, silicon carbon nitride, silicon oxynitride, FSG, a low-k dielectric material, other suitable insulating material, and/or combinations thereof. In an exemplary embodiment, the gap fill structures 402 can be formed by blanket depositing a gap fill material over the exposed surfaces and in the openings and performing a planarization process to remove the excessive gap fill material that is formed over the top surfaces of the hard masks 306 and the seed layer structures 310 such that the top surfaces of partially-fabricated semiconductor structure 400 are coplanar. Exemplary planarization processes can include CMP processes. The gap fill structures 402 can be deposited by CVD, PECVD, PVD, ALD, other suitable processes, and/or combinations thereof. Other fabrication techniques for the gap fill structures 402 are possible. The gap fill structures 402 can include a multi-layer structure such as, for example, a structure with one or more liner layers. The gap fill structures 402 can also be formed by depositing an enhanced gap fill layer using multi-step deposition and treatment process to eliminate voids and seams in the spacer material.

After the gap fill structures 402 are formed, the seed layer structures 310 are etched back to form the seed layer structures 410. The seed layer structures 310 can be etched by any suitable etching processes for example, an RIE processes, a wet etching process, other suitable processes, and/or combinations thereof. In an exemplary embodiment, the etching process can be an anisotropic etching process. In an exemplary embodiment, the etching selectivity can be substantially different between seed layer material and other structures of the partially-fabricated semiconductor structure 400 by controlling etching parameters of the etch process. The etching process can continue until a nominal thickness of the partially-fabricated semiconductor structure 400 is reached. In an exemplary embodiment, the thickness of the seed layer structures 410 can be in a range of between about 5 Å to about 15 Å (e.g., 5 Å to 15 Å). In an exemplary embodiment, the seed layer structures 410 can have a thickness of about 10 Å. The thickness of the seed layer structures 410 can be determined by a few factors, including but not limited to, the thickness uniformity and impact on conductivity. For example, a reduced seed layer thickness may impact the uniformity of the seed layer thickness, while a greater thickness may impact the overall conductivity of the subsequently formed conductive rails.

Figure 5:
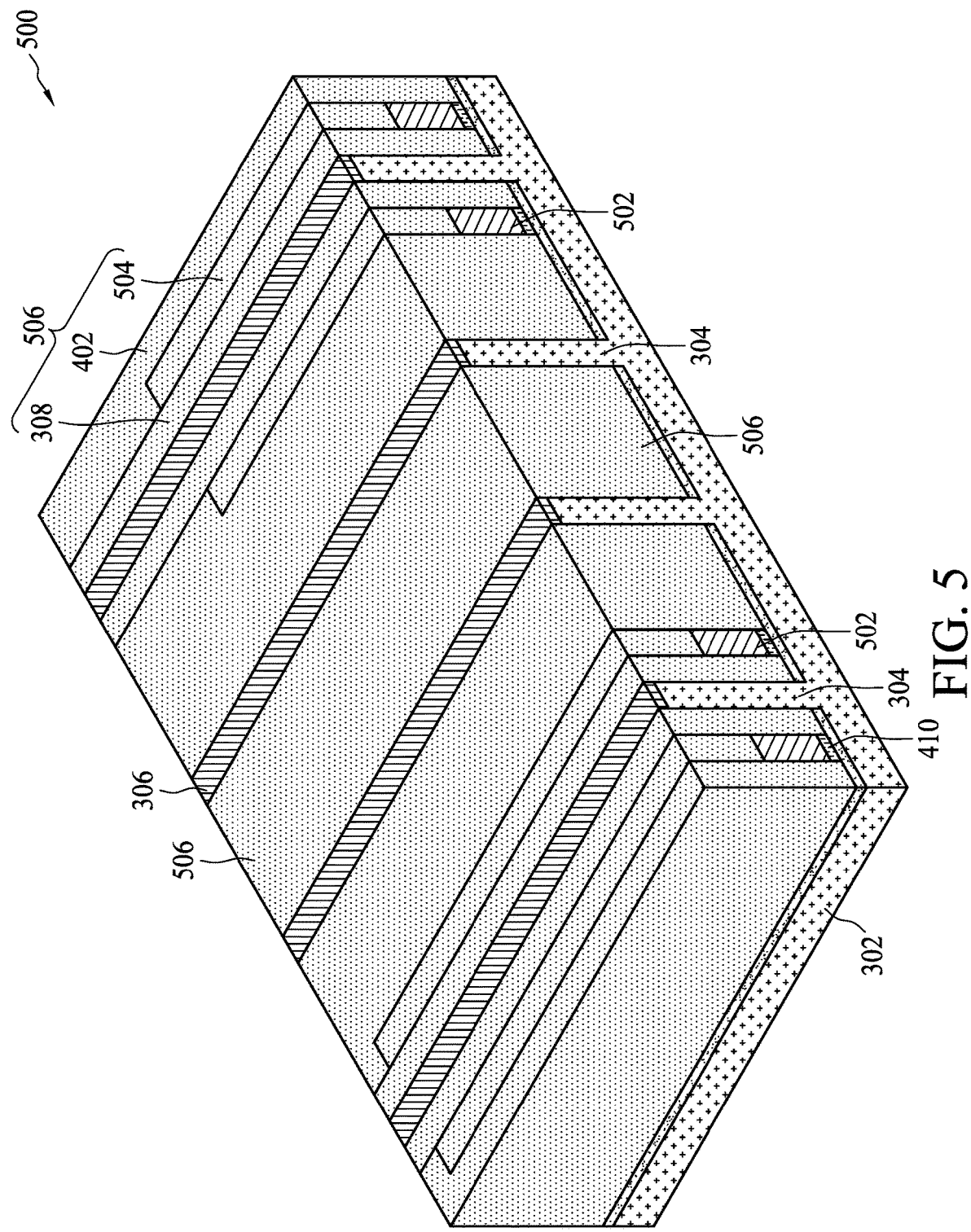
FIG. 5 is isometric views of a partially-fabricated semiconductor structure after conductive rails and interlayer dielectric fills are formed in accordance with some embodiments.

FIG. 5 is isometric views of a partially-fabricated semiconductor structure after conductive rails and interlayer dielectric fills are formed according to an exemplary embodiment of the present disclosure. As illustrated in FIG. 5, partially-fabricated semiconductor structure 500 includes the substrate 302, the fin structures 304, the hard masks 306, the dielectric spacers 308, the gap fill structures 402, the seed layer structures 410, conductive rails 502, and dielectric fill 504. In an exemplary embodiment, the dielectric spacers 308, the gap fill structures 402, and the dielectric fill 504 can be formed of the same material. For simplicity purposes they are combined and illustrated as an interlayer dielectric (ILD) 506 (also referred to as a dielectric region).

As illustrated in FIG. 5, the conductive rails 502 can be formed on the seed layer structures 410. In an exemplary embodiment, the conductive rails 502 can be formed of any metal materials or conductive materials, such as tungsten, cobalt, copper, aluminum, other suitable materials, and/or combinations thereof. In an exemplary embodiment, the conductive rails 502 can be formed using metal alloys of the above listed material. The top surface of the conductive rails 502 can be a substantially smooth surface. The conductive rails 502 can be formed using the seed layer structures 410 as a seed layer where the growth of the conductive rails 502 is started. For example, the conductive rails 502 can start forming from the top surface of the seed layer structures 410 until a nominal thickness of the conductive rail is achieved. In an exemplary embodiment, the growth of conductive rail material can be completed using suitable processes such as CVD, electroplating, electroless plating, other suitable processes, and/or combinations thereof. For example, tungsten material can be formed using silicon material as a seed layer. The height of the conductive rails 502 can be in a range between about 0.8 to about 1.2 times the gate pitch of the finFET devices. In an exemplary embodiment, the width of conductive rails can be in a range between about 0.8 to about 2.2 times the width of the tin structures 304. In an exemplary embodiment, the pitch of conductive rails (i.e., the distance between centers of adjacent conductive rails) can be in a range between about 0.8 to about 1.2 times the fin pitch of the fin structures 304. In an exemplary embodiment, each the conductive rails 502 can have substantially similar widths or heights. In an exemplary embodiment, the widths or heights can be different between each of the conductive rails 502.

After the conductive rails 502 are formed, the dielectric fills 504 are formed over the conductive rails 502 and filling the openings within the gap fill structures 402. In an exemplary embodiment, the dielectric fills 504 can be formed by performing a blanket deposition of dielectric fill material on the structure until the openings within the gap fill structures 402 are completely filled. A planarization process is subsequently performed to remove the excessive dielectric fill material and planarize the dielectric fill material until the top surfaces of the dielectric fill material are coplanar with the hard masks 306. After the planarization process, the planarized dielectric fill material forms the dielectric fills 504. In an exemplary embodiment, the dielectric fills 504 can be formed using the same material as dielectric spacers 308 and the gap fill structures 402. For example, the dielectric fills 504 can be formed using silicon oxide, spin-on-glass, silicon nitride, silicon carbide, silicon carbon nitride, silicon oxynitride, FSG, a low-k dielectric material, other suitable insulating material, and/or combinations thereof. In some situations, the dielectric spacers 308, the gap fill structures 402, and the dielectric fills 504 can be formed using the same material as illustrated as the ILD 506 for simplicity.

Figure 6:
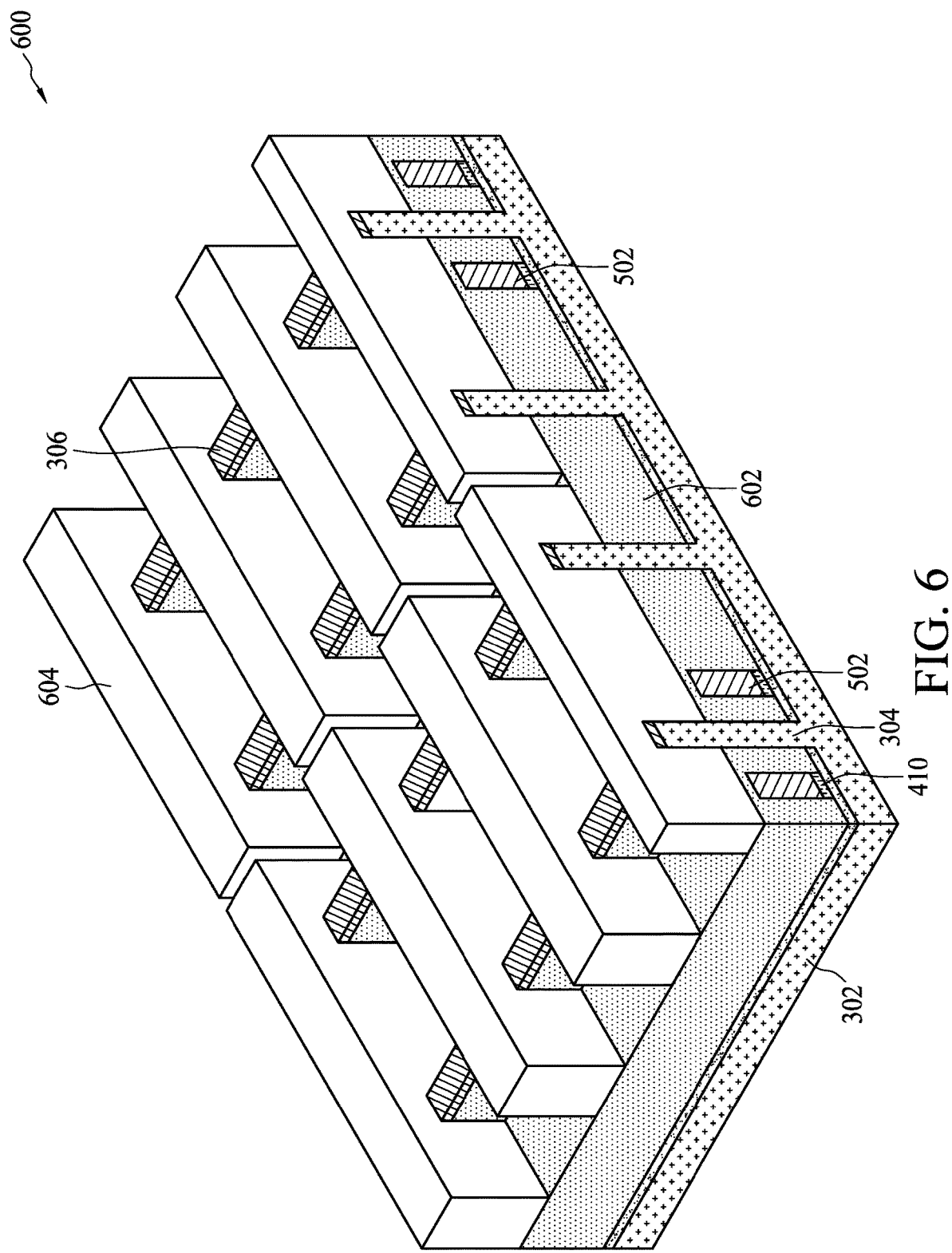
FIG. 6 is an isometric view of a partially-fabricated semiconductor structure after etching back the ILD layer and forming poly gates over the fins in accordance with some embodiments.

FIG. 6 is an isometric view of a partially-fabricated semiconductor structure after etching back the ILD layer and forming poly gates over the fins according to an exemplary embodiment of the present disclosure. Partially-fabricated semiconductor structure 600 includes the substrate 302, the fin structures 304, the hard masks 306, the seed layer structures 410, the conductive rails 502, partially-etched ILD 602, and poly gate structures 604.

In the exemplary embodiment illustrated in FIG. 6, the ILD 506 from partially-fabricated semiconductor structure 500 of FIG. 5 is uniformly etched until a nominal depth is achieved. The etching process can be an isotropic etching process where the etched thickness of the ILD 506 is uniform across the semiconductor structure. The ILD 506 forms partially-etched ILD 602 after the etching process. After the etching process, portions of the fin structures 304 can protrude from the top surfaces of the partially-etched ILD 602. The amount of the ILD 506 removed can depend upon a few factors. First, the protruding portions of the fin structures 304 are used to form the active portions of finFET devices in subsequent fabrication steps. For example, the protruding portions of the fin structures 304 represent active portions of the fin that are used to form the channel and source/drain regions of the finFET devices. Therefore, a sufficient height for the fin structures 304 can be above the top surfaces of partially-etched ILD 602. Second, the conductive rails 502 should remain under partially-etched ILD 602 after the etching process without being exposed.

After the partially-etched ILI) 602 is formed, the poly gate structures 604 can be formed on the exposed surfaces of the fin structures 304 including top surfaces and sidewall surfaces not covered by the partially-etched ILD 602. In an exemplary embodiment, portions of the hard masks 306 can be patterned and removed before depositing the poly gate material such that the poly gate structures 604 can form directly on the top surfaces of the fin structures 304. In an exemplary embodiment, removing the hard mask layer includes performing a wet chemical process with phosphoric acid ($H_3PO_4$) that etches silicon nitride. The poly gate structures 604 can be formed by blanket depositing a semiconductor material and performing patterning and etching processes. The poly gate structures 604 can include a gate dielectric layer, a gate electrode structure, and/or one or more additional layers, according to some embodiments. In an exemplary embodiment, the poly gate structures 604 use polysilicon as the gate electrode structures. In an exemplary embodiment, the poly gate structures 604 use amorphous silicon as the gate electrode structure. In an exemplary embodiment, the poly gate structures 604 can be sacrificial gate structures such as formed in a gate replacement process used to form metal gate structures. In an exemplary embodiment, a hard mask (not shown in FIG. 6) is disposed on a top surface of the poly gate structures 604. The hard mask can be used to pattern, such as by etching, semiconductor material to form the poly gate structures 604. In an exemplary embodiment, the hard mask can be made of a dielectric material, such as silicon nitride. In an exemplary embodiment, the poly gate pitch (i.e., the distance between centers of adjacent poly gate structures 604) can be in a range between about 10 nm to about 300 nm.

Figure 7:
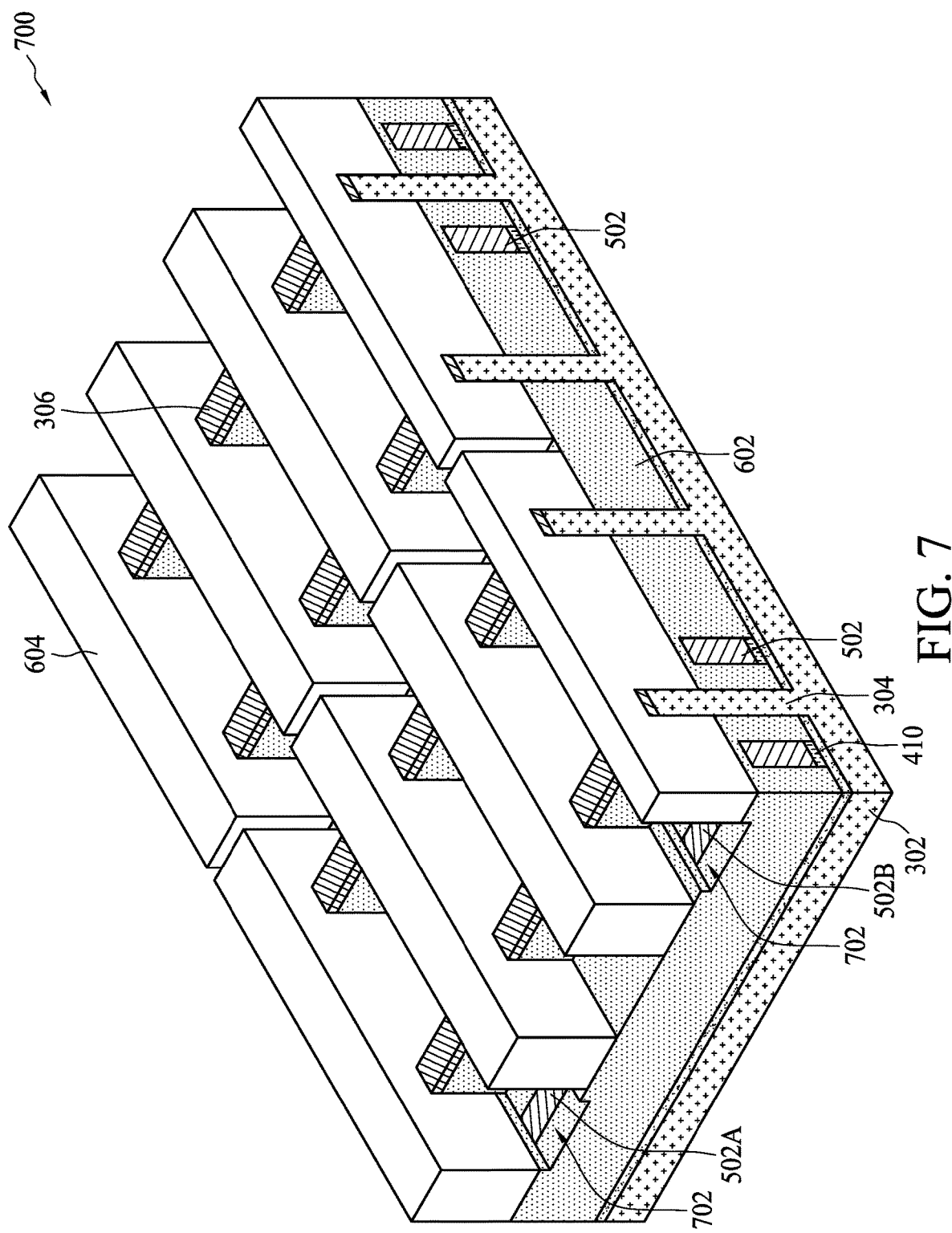
FIG. 7 is an isometric view of a partially-fabricated semiconductor structure after opening a trench in the partially-etched ILD to expose portions of conductive rails in accordance with some embodiments.

FIG. 7 is an isometric view of a partially-fabricated semiconductor structure after opening a trench in the partially-etched ILD to expose portions of conductive rails according to an exemplary embodiment of the present disclosure. Partially-fabricated semiconductor structure 700 includes the substrate 302, the fin structures 304, the hard masks 306, the seed layer structures 410, the conductive rails 502, the partially-etched ILD 602, the poly gate structures 604, and trenches 702 formed in the partially-etched ILD 602.

In the exemplary embodiment illustrated in FIG. 7, the trenches 702 are formed between adjacent poly gate structures 604 and in the partially-etched ILD 602. The trenches 702 are used to expose portions of one or more of the conductive rails 502 that are formed between adjacent poly gate structures 604 such that subsequent structures (e.g., source/drain contacts and/or gate contacts) can form direct electrical contact with the conductive rails 502. The specific the conductive rails 502 to be exposed depend on circuit designs and can be one or more of the conductive rails 502. The fabrication process to expose selected conductive rails 502 can include patterning and removing portions of the partially-etched ILD 602 that are formed over the selected conductive rails 502. In an exemplary embodiment, an entire area of the partially-etched ILD 602 that is surrounded by opposing adjacent fin structures 304 and opposing adjacent poly gate structures 604 is etched to expose the underlying conductive rails 502. Exposing the entire area described above maximizes contact area to the conductive rails 502 and thus provides the benefit of minimizing contact resistance to the conductive rails 502. In an exemplary embodiment, only portions of the area are exposed. For example, conductive rail regions 502A and 502B of the conductive rails 502 are exposed as illustrated in FIG. 7. Patterning and exposing a portion of the area provides the benefit of a greater tolerance to lithography alignment as it reduces the possibility of exposing unwanted adjacent areas of the partially-etched ILD 602 in case a misalignment occurs. In an exemplary embodiment, the area exposed depends on the circuit and device needs and considerations. The patterning process can include forming a photoresist layer overlying the structure (e.g., on the poly gate structures), exposing the resist to a pattern, performing post-exposure bake processes, and developing the resist to form a masking element including the resist. Due to the small feature size and pitch between adjacent poly gate structures 604, the patterned photoresist sheet can have sufficient mechanical strength to suspend between adjacent poly gate structures or hang as a ledge over the edge of a poly gate structure. After the patterned photoresist is formed, one or more etching processes can be performed to remove the exposed partially-etched ILD 602 to expose the selected underlying the conductive rails 502.

Figure 8:
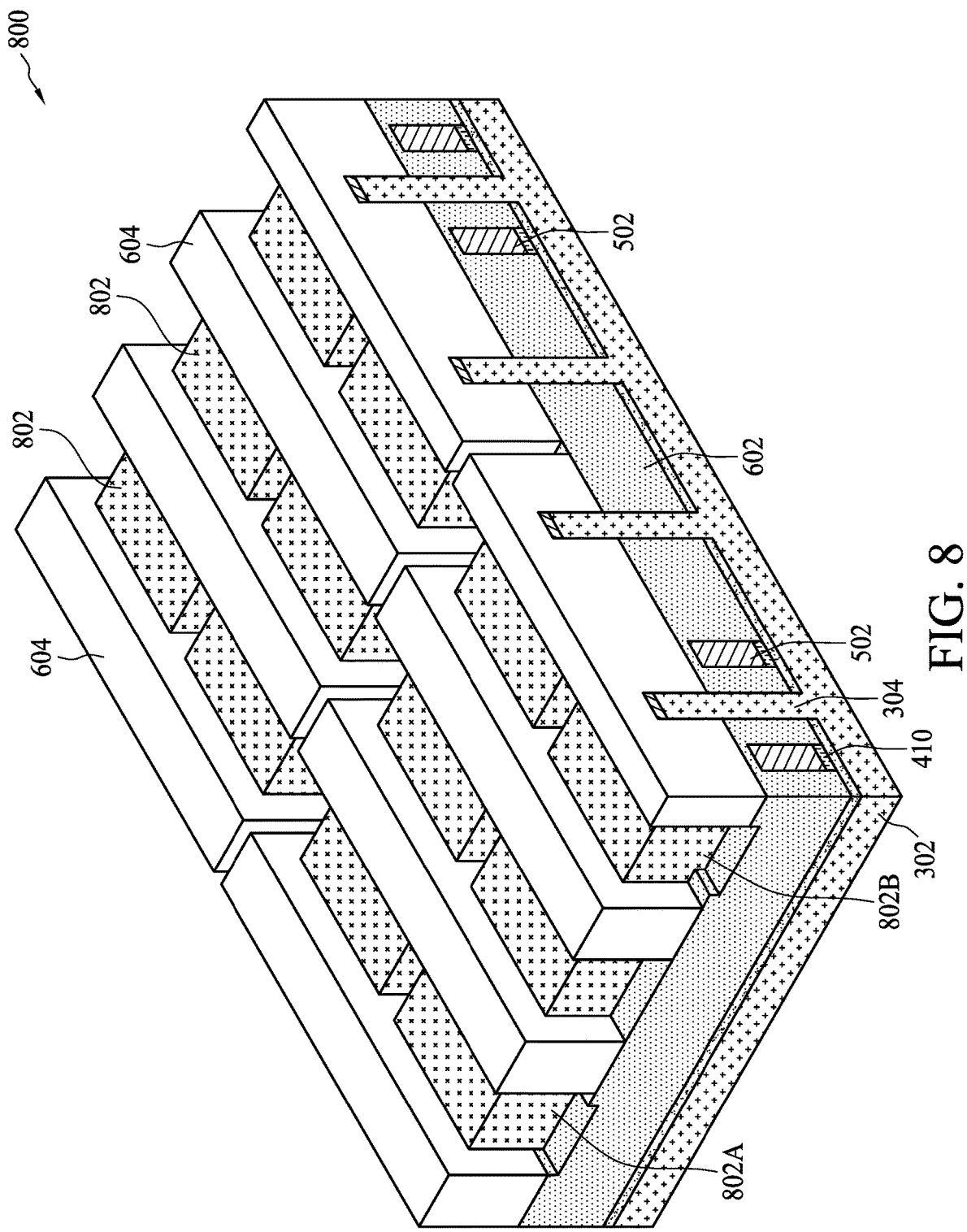
FIG. 8 is an isometric view of a partially-fabricated semiconductor structure after source/drain terminals are formed in accordance with some embodiments.

FIG. 8 is an isometric view of a partially-fabricated semiconductor structure after source/drain terminals are formed according to an exemplary embodiment of the present disclosure. Partially-fabricated semiconductor structure 800 includes the substrate 302, the fin structures 304, the seed layer structures 410, the conductive rails 502, the partially-etched ILD 602, the poly gate structures 604, and epitaxial source/drain terminals 802.

In the exemplary embodiment illustrated in FIG. 8, each finFET includes a pair of source/drain terminals. The source and drain terminals are interchangeable and are formed in, on, and/or surrounding the fin structures 304. A source or drain terminal is formed on one side of a poly gate structure. In an exemplary embodiment, adjacent finFET devices share a common source/drain terminal. Channel regions of the fin structures 304 underlie the respective the poly gate structures 604. One or more epitaxial source/drain terminals 802 directly contact and are electrically connected to the exposed conductive rails. For example, epitaxial source/drain terminals 802A and 802B of epitaxial source/drain terminals 802 respectively connects to conductive rail regions 502A and 502B. Although only epitaxial source/drain terminals 802A and 802B are shown to be connected in FIG. 8, other source/drain terminals can also be connected depending on the design and device needs. Because the conductive rails are formed within the partially-etched ILD 602, they can electrically connect multiple source/drain terminals without occupying additional device space.

As illustrated in FIG. 8, the epitaxial source/drain terminals 802 can be formed on active fin structures of the fin structures 304 that are protruding from the top surface of the partially-etched ILD 602. In an exemplary embodiment, the epitaxial source/drain terminals 802 can be epitaxial source/drains terminals that are formed by growing epitaxial layers over exposed surfaces of fin 304. In an exemplary embodiment, the hard masks 306 are removed from the top of the fin structures 304 prior to the formation of the epitaxial source/drain terminals 802. In an exemplary embodiment, the fin structures 304 are formed using epitaxial material such as epitaxial silicon, epitaxial silicon germanium (SiGe), gallium arsenide, other suitable materials, and/or combinations thereof. Growing the epitaxy layers on exposed surfaces of the fin structures 304 can include performing a pre-clean process to remove the native oxide on the surface of the fin structures 304. Next, an epitaxy process is performed to grow the epitaxy layers on the exposed surfaces of the fin structures 304. In an exemplary embodiment, the epitaxy process is an SiGe epitaxy process performed at a temperature between about 400° C. and about 1000° C. (e.g., between 400° C. and 1000° C.). The epitaxy process is a selective process that only grows the epitaxy layer on the exposed surfaces of the active fin structures. The epitaxy process can use the exposed surfaces of the fin structures 304 as seed layers and the growth process continues until a nominal size and/or structure of source/drain terminals has been reached. An in-situ doping process can also be performed during the epitaxy process. In an exemplary embodiment, epitaxial source/drain terminal 802 is a SiGe structure. In an exemplary embodiment, the epitaxial source/drain terminals 802 can be a silicon structure. In an exemplary embodiment, the thickness of the epitaxial source/drain terminals 802 is between about 10 nm and about 20 nm (e.g., between 10 nm and 20 nm). In an exemplary embodiment, the epitaxial source/drain terminals 802 are doped with p-type or n-type dopants during the epitaxy process. For example, the epitaxial source/drain terminals 802 can be doped with boron (B) during the epitaxy process. The epitaxial source/drain terminals 802 can also take different shapes depending on various factors such as, for example, the epitaxy process condition, the crystalline orientation of active fin structures, and/or other suitable factors. In an exemplary embodiment, the shape of the epitaxial source/ drain terminals 802 using epitaxial material have a substantially diamond-shaped cross section. In an exemplary embodiment, top surfaces of the epitaxial source/drain terminals 802 can be recessed below top surfaces of the poly gate structures 604 as illustrated in FIG. 8. In an exemplary embodiment, the top surfaces of the epitaxial source/drain terminals 802 are substantially coplanar as the top surfaces of the poly gate structures 604.

Figure 9:
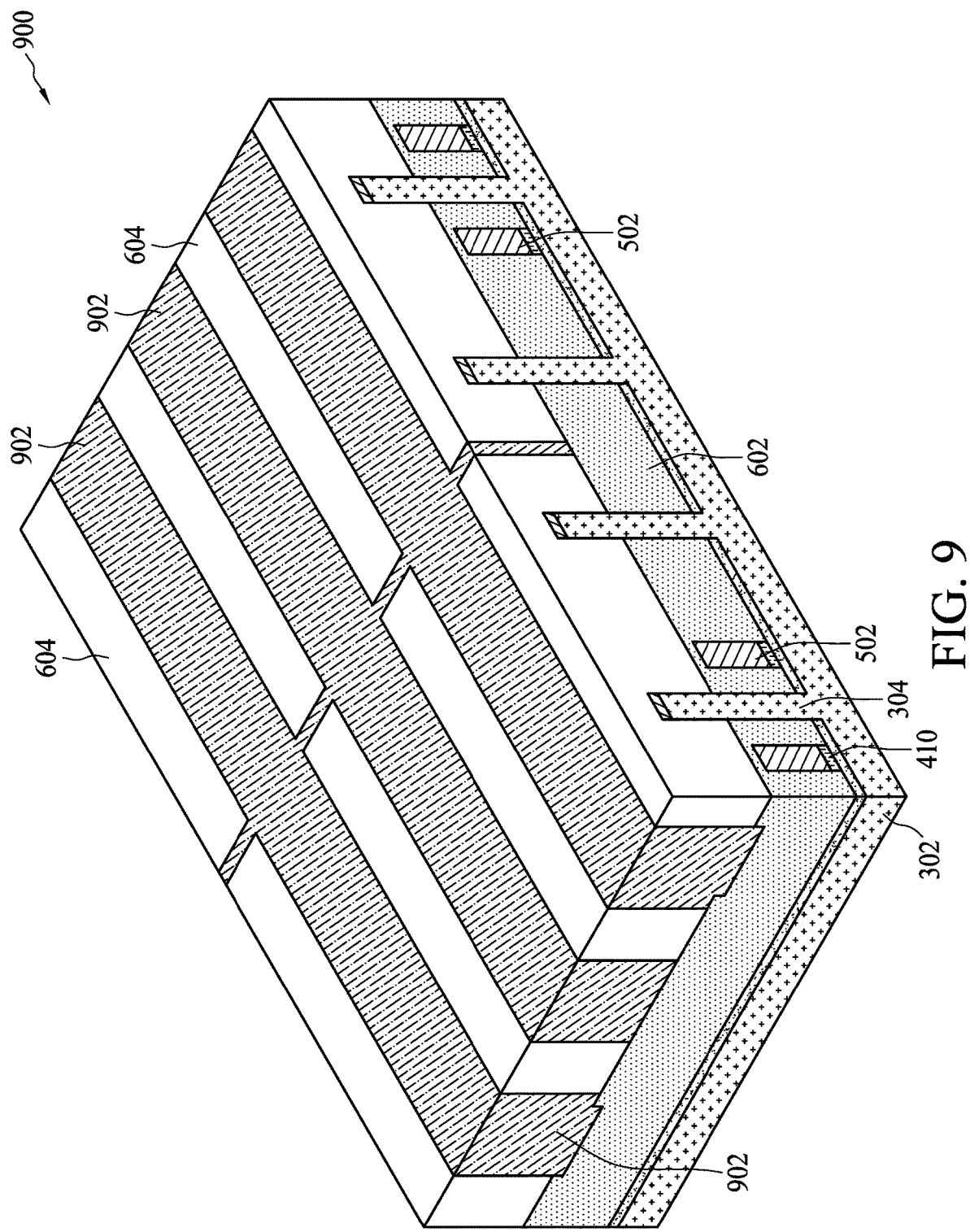
FIG. 9 is an isometric view of a partially-fabricated semiconductor structure after shallow trench isolation structures are formed in accordance with some embodiments.

FIG. 9 is an isometric view of a partially-fabricated semiconductor structure after shallow trench isolation structures are formed according to an exemplary embodiment of the present disclosure. Partially-fabricated semiconductor structure 900 includes the substrate 302, the fin structures 304, the seed layer structures 410, the conductive rails 502, the partially-etched ILD 602, the poly gate structures 604, and shallow trench isolation (STI) structures 902.

As illustrated in FIG. 9, the STI structures 902 can be deposited in openings of the partially-fabricated semiconductor structure 800 described above with reference to FIG. 8. The STI structures 902 can be used to provide electrical isolation and mechanical support for subsequently formed structures. The STI structures 902 can be formed using dielectric material such as, for example, silicon oxide, spin-on-glass, silicon nitride, silicon oxynitride, FSG, a low-k dielectric material, other suitable insulating material, and/or combinations thereof. The ST1 structures 902 can be formed by depositing insulating dielectric material to fill the openings followed by a planarization process (e.g., a CMP process). The STI structures 902 can be deposited by CVD, PECVD, PVD, ALD, other suitable processes, and/or combinations thereof. Other fabrication techniques for the STI structures 902 are possible. The STI structures 902 can include a multi-layer structure such as, for example, a structure with one or more liner layers. The STI structures 902 can also be formed by depositing an enhanced gap fill layer using the multi-step deposition and treatment process to eliminate voids and seams in the dielectric material. After the planarization process, the top surfaces of the poly gate structures 604 and the STI structures 902 are coplanar.

Figure 10:
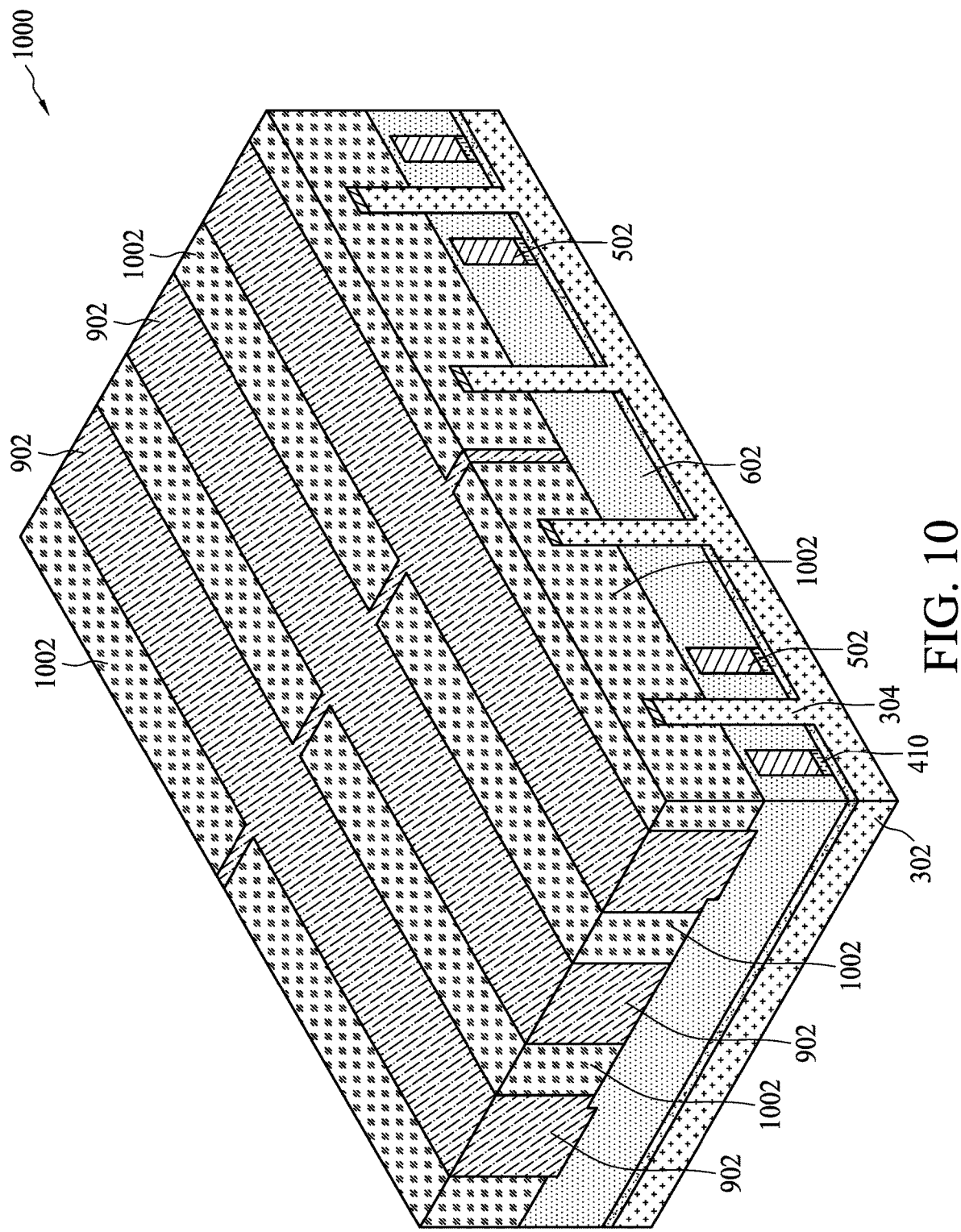
FIG. 10 is an isometric view of a partially-fabricated semiconductor structure after a gate replacement process in accordance with some embodiments.

FIG. 10 is an isometric view of a partially-fabricated semiconductor structure after a gate replacement process according to an exemplary embodiment of the present disclosure. Partially-fabricated semiconductor structure 1000 includes the substrate 302, the fin structures 304, the seed layer structures 410, the conductive rails 502, the partially-etched IUD 602, the STI structures 902, and metal gate structures 1002.

As described above with reference to FIG. 6, although the poly gate structures 604 are described as using polysilicon or amorphous silicon, the poly gate structures 604 can be sacrificial gate structures such as formed in a replacement gate process used to form metal gate structures. For example, the poly gate structures 604 can be replaced by metal gate structures 1002 (also referred to as gate regions) as illustrated in FIG. 10. The metal gate structures 1002 can further include barrier layer(s), gate dielectric layer(s), work function layer(s), fill metal layer(s), and/or other suitable materials for metal gate structures. In an exemplary embodiment, the metal gate structures 1002 can include capping layers, etch stop layers, and/or other suitable materials. The gate replacement process can be a self-aligned gate replacement process where no alignment is needed. For example, the gate replacement process can begin by removing the poly gate structures 604 through an etching process such as, for example, a dry etching process, a wet etching process, other suitable processes, and/or combinations thereof. The removal of the poly gate structures 604 leaves openings in the partially-fabricated semiconductor structure 1000. Conductive material used to form the metal gate structures 1002 can be then blanket deposited over the openings. A subsequent planarization process can then be used such that the top surfaces of STI structures 902 and the metal gate structures 1002 are coplanar. After the planarization process, the deposited metal gate material forms the metal gate structures 1002. Because the deposited metal gate material forms in the openings without the need of alignment, the gate replacement process is a self-aligned process.

Figure 11:
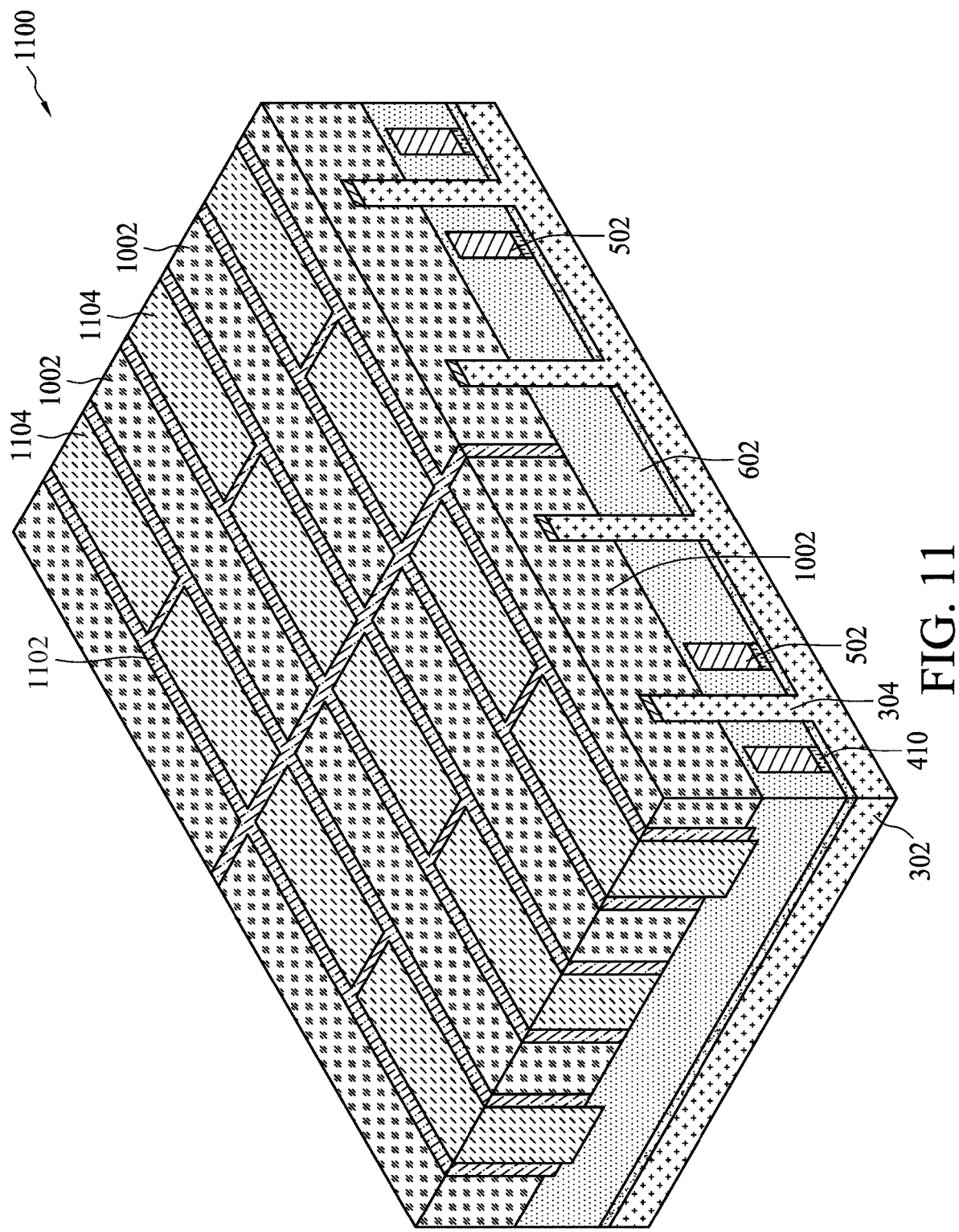
FIG. 11 is an isometric view of a partially-fabricated semiconductor structure after forming metal source/drain contacts in accordance with some embodiments.

FIG. 11 is an isometric view of a partially-fabricated semiconductor structure after forming metal source/drain contacts according to an exemplary embodiment of the present disclosure. Partially-fabricated semiconductor structure 1100 includes the substrate 302, the fin structures 304, the seed layer structures 410, the conductive rails 502, the partially-etched ILD 602, the metal gate structures 1002, etched STI structures 1102, and source/drain contacts 1104.

In the exemplary embodiment illustrated in FIG. 11, the source/drain contacts 1104 can be metallic contacts that are formed directly on the epitaxial source/drain terminals 802 and used to provide electrical connection to the epitaxial source/drain terminals 802. Patterning and etching processes can be used to form openings in the STI structures 902 for the deposition of source/drain contact material. In an exemplary embodiment, STI material can be removed from between opposing the metal gate structures 1002 to expose underlying the epitaxial source/drain terminals 802. In an exemplary embodiment, this STI material can remain between adjacent fin structures 304 to provide electrical isolation. The etched STI structures 1102 are formed by patterning and etching the STI material to expose the underlying the epitaxial source/drain terminals 802. In an exemplary embodiment, the source/drain contacts 1104 are formed by a blanket deposition using an ALD process, a CVD process, a PVD process, or a combination thereof. In an exemplary embodiment, the source/drain contacts 1104 can be made of metal such as, for example, cobalt (Co), tungsten (W), copper (Cu), nickel (Ni), ruthenium (Ru), or other suitable materials. In an exemplary embodiment, a planarization process (e.g., a CMP process) is performed to remove excessive source/drain contact material of the source/drain contacts 1104 that are formed over the top surfaces of the STI structures 902 and the metal gate structures 1002. The source/drain contacts 1104 can be formed after the planarization process, and the top surfaces of the source/drain contacts 1104, the etched STI structures 1102, and the metal gate structures 1002 are coplanar. In an exemplary embodiment, the source/drain contacts 1104 can further include a barrier layer to avoid diffusion of materials from the source/drain contacts 1104 into the etched STI structures 1102.

In an exemplary embodiment, forming the source/drain contacts 1104 can further include forming a silicide layer between the source/drain contacts 1104 and the epitaxial source/drain terminals 802. In an exemplary embodiment, an etch process is performed to recess the top surfaces of the epitaxial source/drain terminals 802 to form a flat surface for the source/drain contacts. In an exemplary embodiment, recessing the epitaxial source/drain terminals 802 increases the contact area between the source/drain contacts 1104 and the epitaxial source/drain terminals 802 which can reduce contact resistance. In an exemplary embodiment, forming the silicide layer is performed by a silicidation process that includes depositing a metal layer, causing the metal to react with the epitaxy layers or the active fin structures, and removing the un-reacted metal layer. In an exemplary embodiment, the silicide layer can include cobalt silicide (CoSix), nickel silicide (NiSix), other suitable silicide layers, and/or combinations thereof.

Figure 12:
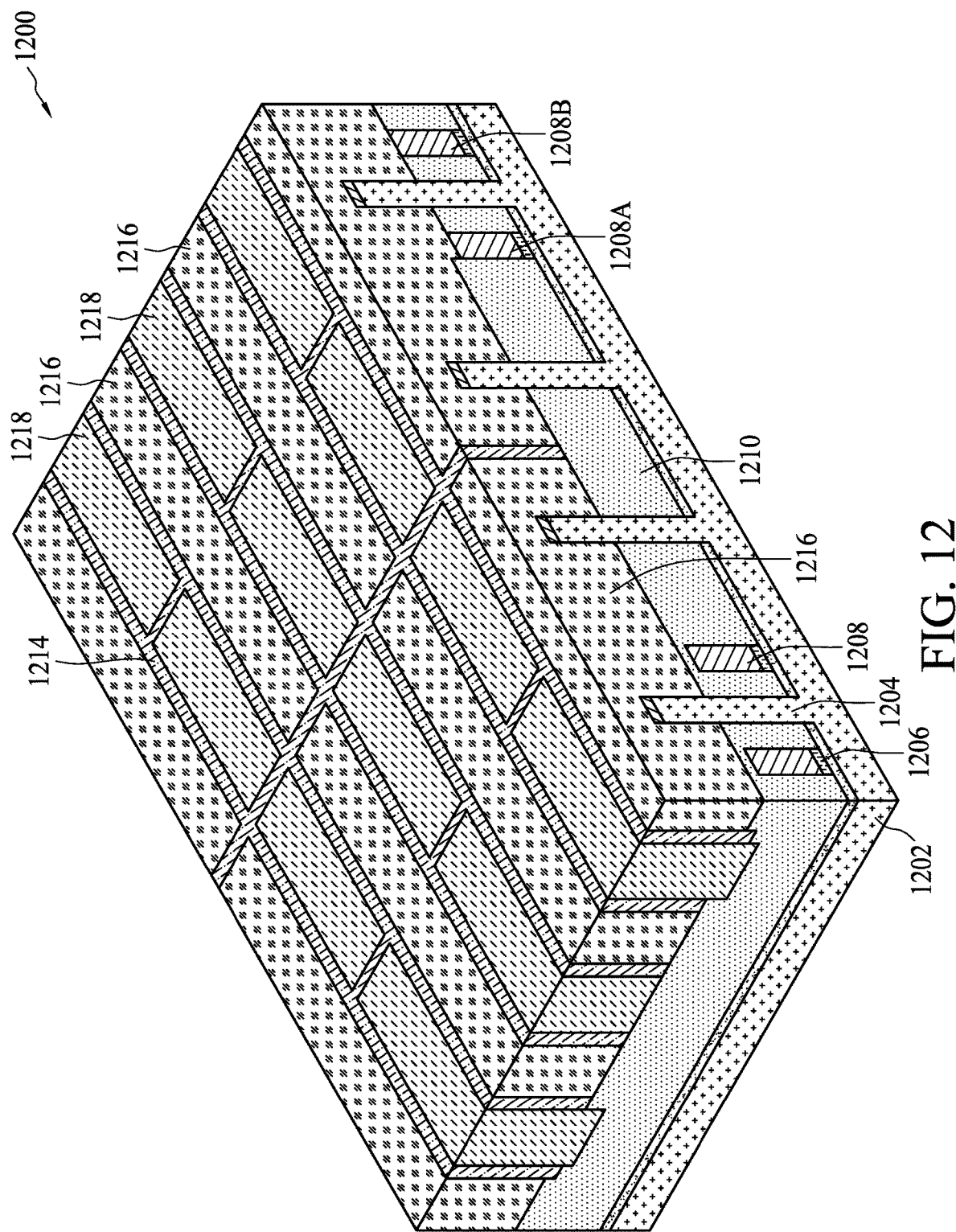
FIG. 12 is an isometric view of a partially-fabricated semiconductor structure after depositing metal gate material and forming source/drain contacts in accordance with some embodiments.

In some embodiments, conductive rail structures formed in interlayer dielectric materials can be used to provide electrical connection between multiple gate structures of finFET arrays. FIG. 12 is an isometric view of a partially-fabricated semiconductor structure after depositing metal gate material and forming source/drain contacts according to an exemplary embodiment of the present disclosure. The partially-fabricated semiconductor structure 1200 includes structures similar to the structures formed in FIGS. 3-9. For example, the partially-fabricated semiconductor structure 1200 includes a substrate 1202, fin structures 1204, partially-removed seed layer structures 1206, conductive rails 1208, partially-etched ILD 1210 and STI structures 1214 that are similar to their respective structures in FIGS. 3-9. In an exemplary embodiment, the partially-fabricated semiconductor structure 1300 can be formed after removing the poly gate structures 604 of FIG. 9. In an exemplary embodiment, the removal process can be a self-aligned removal process where no patterning process is needed. For example, the removal process can have high etch selectivity of the poly gate material over other exposed structures so a mask material is not needed to shield the other exposed structures. In an exemplary embodiment, exposed structures other than the poly gate structures can be covered to provide further protection from the removal process.

After the removal process (the poly gate material is completely removed), the underlying fin structures 1204 and partially-etched ILD 1210 are exposed, and the conductive rails 1208 remain under partially-etched ILD 1210. This operation can be similar to the etching process as described in FIG. 6. Next, trenches are formed in selective openings where poly gate material has been removed, and the formed trenches are used to expose portions of one or more conductive rails 1208 such that subsequent structures gate electrodes) can form direct electrical contact with the one or more conductive rails 1208. In an exemplary embodiment, the trench forming process to expose selected conductive rails 1208 can be similar to the trench forming process described above with reference to FIG. 7. As illustrated in FIG. 12, portions of conductive rails 1208A and 1208B are exposed and directly connected to metal gate structures 1216. In an exemplary embodiment, the deposition of conductive material and formation of metal gate structures 1216 can be similar to the formation of the metal gate structures 1002 as described above with reference to FIG. 10. In an exemplary embodiment, other formation processes can be used. Because the conductive rails are formed within the ILD layer, they can electrically connect multiple metal gate structures without occupying additional device space.

In the exemplary embodiment illustrated in FIG. 12, similar to forming the source/drain contacts 1104 described above with reference to FIG. 11, patterning and etching processes can be used to form openings in the STI structures 1214 for the deposition of source/drain contact material. Next, the source/drain contacts 1218 can be formed directly on the epitaxial source/drain terminals to form source/drain regions. In an exemplary embodiment, portions of STI material can be removed from between opposing metal gate structures 1218 to expose the underlying epitaxial source/drain terminals. In an exemplary embodiment, STI material remains between adjacent fins to provide electrical isolation.

Figure 13:
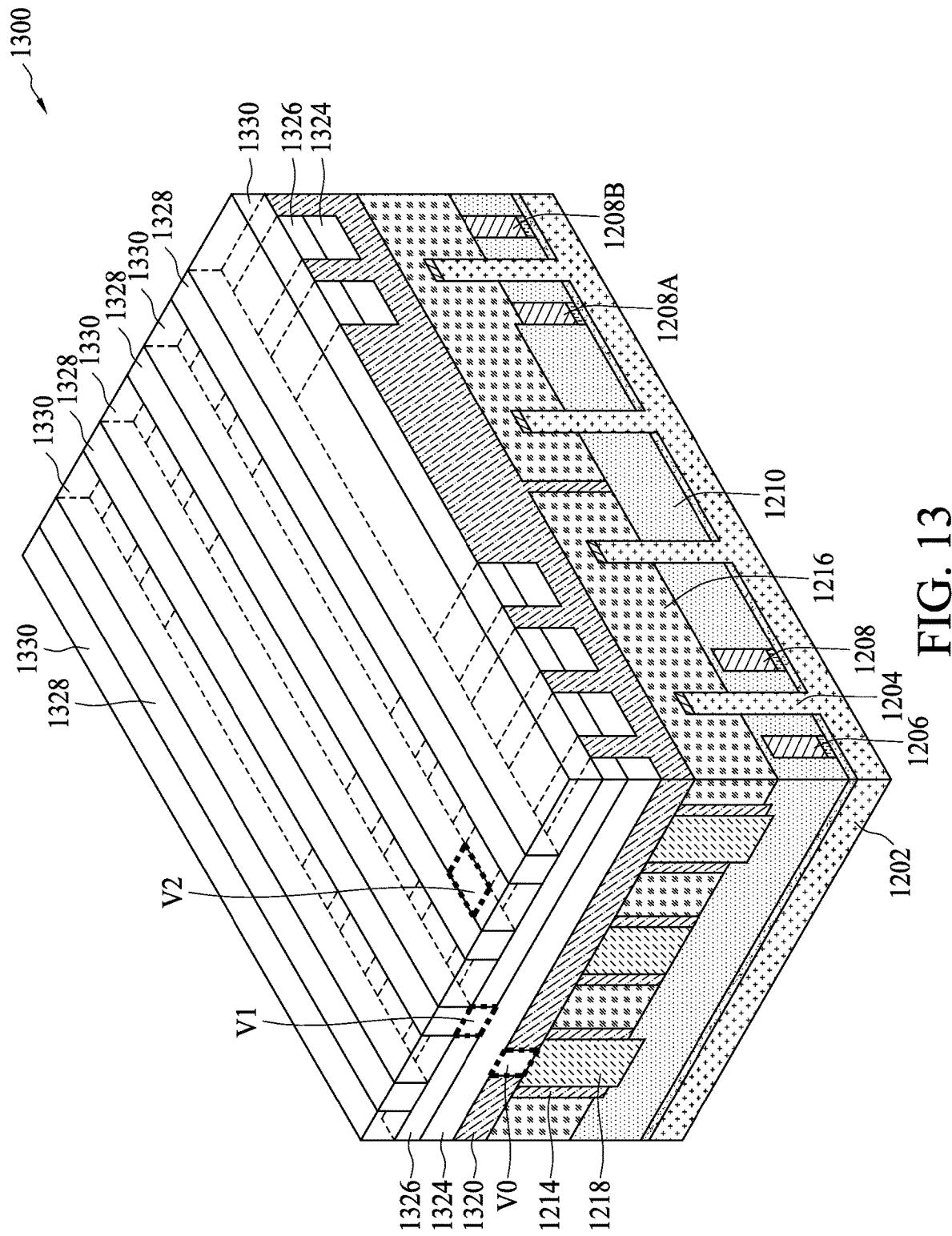
FIG. 13 is an isometric view of a partially-fabricated semiconductor structure including BEOL metal wires with self-aligned vias after depositing metal gate material(s) and forming source/drain contacts in accordance with some embodiments.
Figure 14:
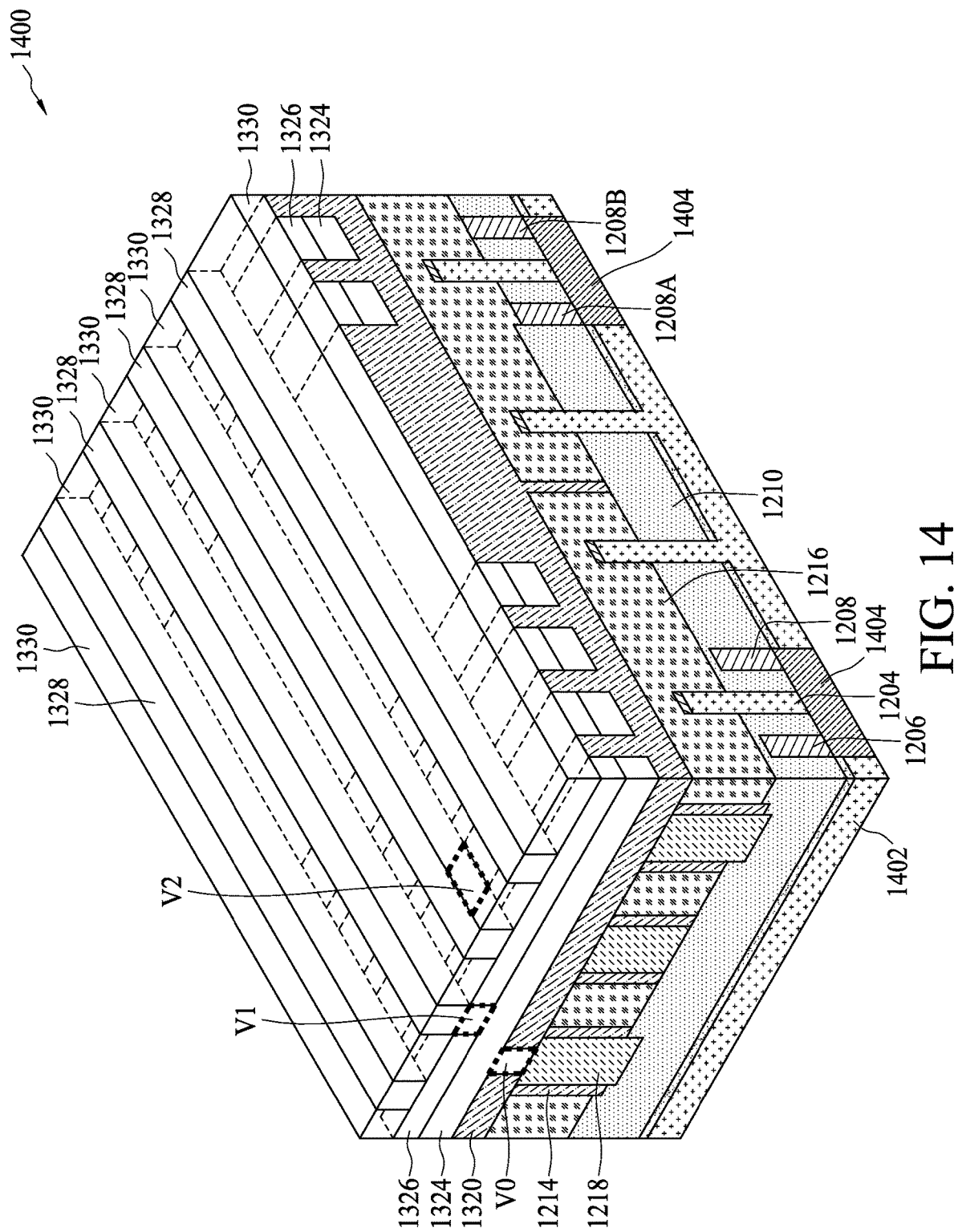
FIG. 14 is an isometric view of a partially-fabricated semiconductor structure after forming BEOL metal wires with self-aligned vias in accordance with some embodiments.
Figure 15:
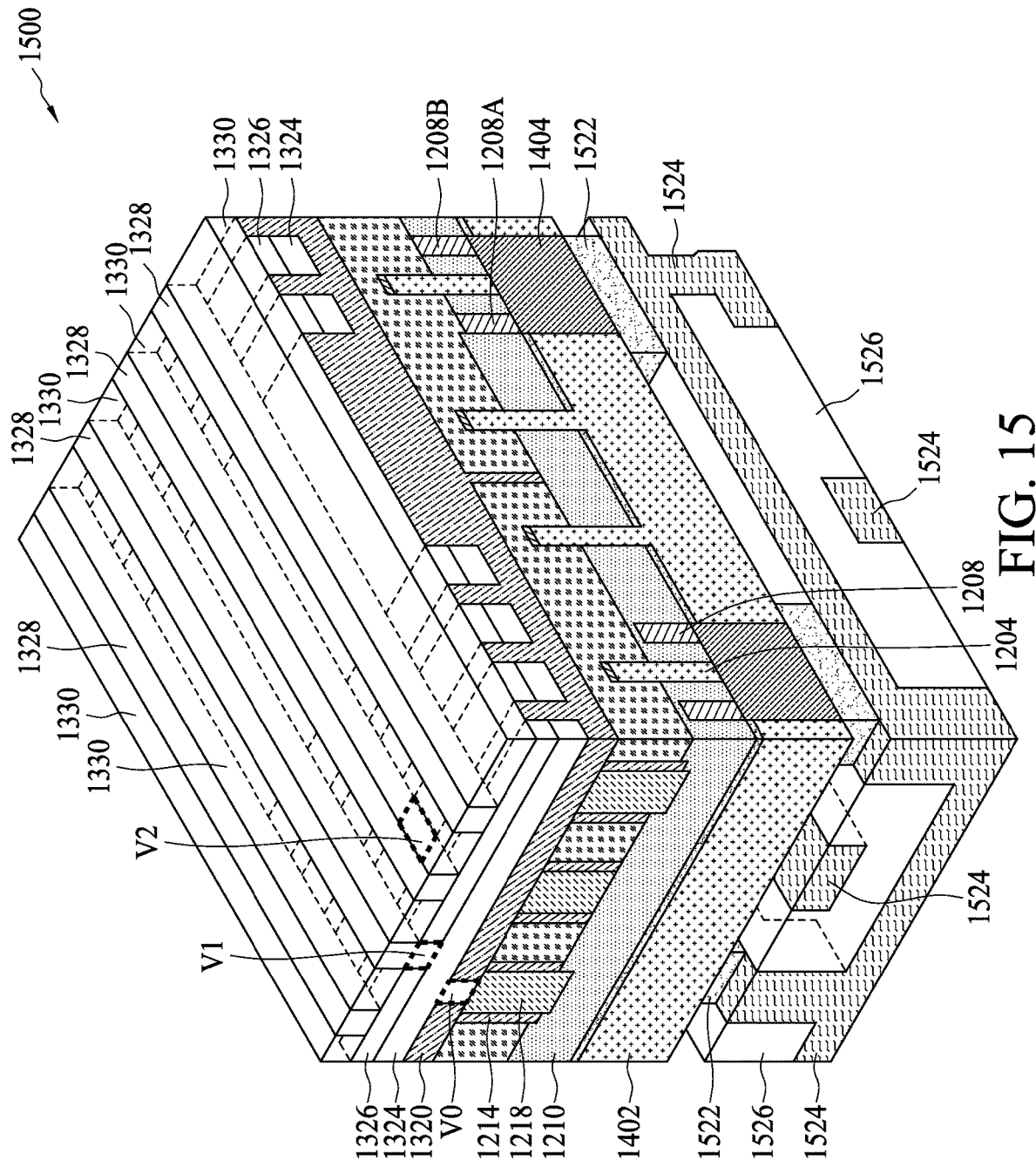
FIG. 15 is an isometric view of a partially-fabricated semiconductor structure after integrating a backside power grid in accordance with some embodiments.

FIGS. 13-15 are isometric views of partially-fabricated semiconductor structures integrating self-aligned via structures and a backside power grid with the partially-fabricated semiconductor structure 1200 according to exemplary embodiments of the present disclosure. Those skilled in the relevant art(s) will recognize the integrated scheme can be applied to semiconductor structures, such as the partially-fabricated semiconductor structure 1100 to provide some examples, without departing from the spirit and scope of the present disclosure.

FIG. 13 is an isometric view of a partially-fabricated semiconductor structure including BEOL metal wires with self-aligned vias after depositing metal gate material(s) and forming source/drain contacts according to an exemplary embodiment of the present disclosure. The partially-fabricated semiconductor structure 1300 includes the substrate 1202, the fin structures 1204, the partially-removed seed layer structures 1206, the conductive rails 1208, the partially-etched ILD 1210, the STI structures 1214, the metal gate structures 1216 and the source/drain contacts 1218 as described in FIG. 12, and further includes a dielectric layer structure 1320, metal wires 1324 each extending in a first direction, dielectric layers 1326 formed on the metal wires 1324, metal wires 1328 each extending in a second direction different from the first direction, and a dielectric layer structure 1330.

In the exemplary embodiment illustrated in FIG. 13, the dielectric layer structure 1320 is formed on the STI structures 1214, the metal gate structures 1216, and the source/drain contacts 1218. The metal wire 1324 can be formed by etching the dielectric layer structure 1320 to create a first trench and depositing conductive material(s) into the first trench, and the dielectric layer 1326 can be deposited over the metal wire 1324 to fill the first trench. Next, the dielectric layer structure 1330 can be formed on the dielectric layer structure 1320 and the dielectric layers 1326.

By etching the dielectric layer structure 1330 to create a second trench, which expose a portion of the dielectric layer structure 1320 and a portion of the dielectric layer 1326, and etching the exposed portion of the dielectric layers 1326 to expose the metal wire 1324, a conductive through via V1 can be created and arranged to electrically connect the metal wire 1324 and the metal wire 1328 after the conductive material(s) are filled into the second trench. In the present embodiment, the conductive through via V1, also referred to as self-aligned vias, can be created based on the difference in etch selectivities between the dielectric layer structure 1320 and the dielectric layers 1326. By way of example but not limitation, after the second trench is created in the dielectric layer structure 1330 to expose the portion of the dielectric layer structure 1320 and the portion of the dielectric layer 1326, the exposed portion of the dielectric layer 1326 can be selectively etched to expose a portion of the metal wire 1324, while the exposed portion of the dielectric layer structure 1320 would not be etched. Hence, the resulting via is created on the exposed portion of the metal wire 1324 and aligned with the exposed portion of the metal wire 1324. After the conductive material(s) are filled into the second trench, the conductive through via V1 and the corresponding metal wire 1328, which is connected to the conductive through via V1, are formed accordingly. In some embodiments, the conductive through via V2 and the corresponding metal wire 1328 can be formed in a similar manner.

As such, a source/drain region including the source/drain contact 1218 can be electrically connected to the metal wire 1328 through the conductive through vias V0 and V1. In some embodiments, it is possible to create a conductive through via between the metal wire 1324 and a gate region including the metal gate structure 1216, such that the gate region can be electrically connected to the metal wire 1328 through the conductive through via, formed between the metal wire 1324 and the gate region, and the conductive through via V1.

FIG. 14 is an isometric view of a partially-fabricated semiconductor structure after forming BEOL metal wires with self-aligned vias according to an exemplary embodiment of the present disclosure. The difference between the partially-fabricated semiconductor structure 1400 and the partially-fabricated semiconductor structure 1300 is that the partially-fabricated semiconductor structure 1400 includes conductive structures 1404, which can include conductive through-substrate via(s) such as a through-silicon via (TSV) and/or a trench-type through-substrate via (e.g. a through-silicon trench (TST)), penetrating the substrate 1402. In some embodiments, the conductive structures 1404 can be formed by etching the substrate 1402 from a backside of the substrate 1402 to create opening(s) to expose one or more conductive rails 1208, and filling conductive material(s) into the opening(s). In some embodiments, the exposed one or more conductive rails 1208 can contact source/drain region(s) and/or gate region(s).

By of example but not limitation, first of all, photoresist is formed on the backside of the substrate 1402. Portions of the photoresist are exposed using a photo mask. Exposed or unexposed portions of the photoresist are then removed, depending on whether a negative or positive photoresist is used, to expose portions of the substrate 1402. Next, an etching process is performed to remove the exposed portions of the substrate 1402. In some embodiments, the etching process includes an RIE process using fluorocarbon gases such as $CF_4$, $CHF_3$, $C_3F_8$, other suitable etchant gases, and/or combinations thereof, but the present disclosure is not limited thereto. The expose portions of the substrate 1402 are etched from the backside to expose the one or more conductive rails 1208. Thereafter, the remaining photoresist was removed. In some embodiments, a plasma aching or wet strip process is used to remove the remaining photoresist. In some embodiments, the plasma asking process is followed by a wet dip in a sulfuric acid ($H_2SO_4$) solution to clean the backside of the substrate 1402 and remove the remaining photoresist.

After the remaining photoresist is removed, deep trench structure(s), or deep via structure(s), having opening(s) is formed from the backside of the substrate 1402 to expose the one or more conductive rails 1208 on the front side of the substrate 1402. Next, conductive material(s), such as Cu, Al, Ti, Ta, W, Nb, Mo, TiN, TiC, TaN, Ti/W or Ti/TiN, any other known conductive or semi-conductive materials, or combinations thereof, is filled into the opening(s) to form the conductive structures 1404. As the opening(s) of the deep trench/via structure(s) has sufficient cross-sectional areas exposed to the front side of the substrate 1402, it is easy to have the filled conductive material(s) coupled to the one or more conductive rails 1208.

In some embodiments, bottom surfaces of the substrate 1402 and the conductive structures 1404 can be substantially coplanar by performing suitable planarization processes on the bottom surfaces of these structures. The planarization process can be, for example, a CMP process. Additionally, or alternatively, a thickness of the substrate 1402 can be less than that of the substrate 1302 shown in FIG. 13. In some embodiments, the substrate 1302 shown in FIG. 13 can be ground using a grinding process, such as a CMP process or other suitable processes, to form the substrate 1402 before the conductive structures 1404 are formed. In these embodiments, after the substrate 1402 is ground to reduce the thickness thereof, the ground substrate 1402 is etched from the backside to create opening(s) to expose the one or more conductive rails 1208.

FIG. 15 is an isometric view of a partially-fabricated semiconductor structure after integrating a backside power grid according to an exemplary embodiment of the present disclosure. The difference between the partially-fabricated semiconductor structure 1500 and the partially-fabricated semiconductor structure 1400 is that the partially-fabricated semiconductor structure 1500 includes metal pads 1522, power grid conductors 1524 and isolation structures 1526. Each metal pad 1522 can be situated between the substrate 1402 and a corresponding power grid conductor 1524 to provide electrical connection between the power grid conductor 1524 and the conductive structure 1404 in the substrate 1402. In some embodiments, the metal pads 1522, as well as the power grid conductors 1524, can be a portion of a power grid. In some embodiments, it is possible to directly connect the power grid conductors 1524 to the conductive structures 1404.

The metal pads 1522 can be formed using photolithography and etching processes. For example, after the conductive structure 1404 is formed, a photoresist can be formed over the backside of the substrate 1402. Portions of the photoresist are exposed using a photo mask. Exposed or unexposed portions of the photoresist are then removed, depending on whether a negative or positive photoresist is used, to create opening(s) which is exposed to the conductive structures 1404. Next, conductive material(s), such as Cu, Al, Ti, Ta, W, Nb, Mo, TiN, TiC, TaN, Ti/W or Ti/TiN, any other known conductive or semi-conductive materials, or combinations thereof, is filled into the opening(s) to form the metal pads 1522. Thereafter, the remaining photoresist was removed. In some embodiments, a plasma ashing or wet strip process is used to remove the remaining photoresist. In some embodiments, the plasma ashing process is followed by a wet dip in a sulfuric acid ($H_2SO_4$) solution to clean the backside of the substrate 1402 and remove the remaining photoresist.

It should be noted that the structure of the power grid conductors 1524 are for illustrative purposes only, and is not intended to limit the scope of the present disclosure. In some embodiments, the power grid conductors 1524 may be arranged in different directions according to design requirements. For example, the structure of the power grid conductors 1524 may include a parallel power rail structures to reduce IR (voltage) drops, wherein one of the power grid conductors 1524 (e.g. a lower power grid conductor) can be disposed in parallel with another of the power grid conductors 1524 (e.g. an upper power grid conductor disposed above the lower power grid conductor).

By integrating conductive structures, penetrating a semiconductor substrate, and the conductive rail structures, situated within a dielectric region on a front side of the semiconductor substrate, into a semiconductor chip (or an integrated circuit), one or more power grids can be disposed on a backside of the semiconductor substrate to provide electrical power for circuit elements on the front side through the conductive structures (e.g. TSVs and/or TSTs) and the conductive rails structures. In other words, as the conductive rails structures can be used for in-cell connection, such as electrical connection between at least two conductive regions of gate region(s), drain region(s) and source region(s), the circuit elements on the front side can be powered by one or more backside power grids rather than front side power lines, thus saving routing resources on the front side. For example, one or more metal wires, originally used as front side power lines, can be used in other applications. Additionally, as the conductive rails structures can be used for in-cell connection, the conductive structures need not to be so deep as to contact conductive regions on the front side, and the conductive regions need not to have jog shapes for connecting the conductive structures.

By further integrating self-aligned via structures for connecting BEOL metal wires on the first side, upper metal wires/layers can be self-aligned with lower metals/layers to reduce misalignments and dielectric breakdowns on a font side of a semiconductor device/chip (or an integrated circuit), such as time dependent dielectric breakdowns (TDDB). The interconnected network of conductive rails and conductive structures can lessen the area in terms of real estate necessary to form the one or more integrated circuits and also save an amount of routing resources used on the front side of the semiconductor chip.

Figure 16:
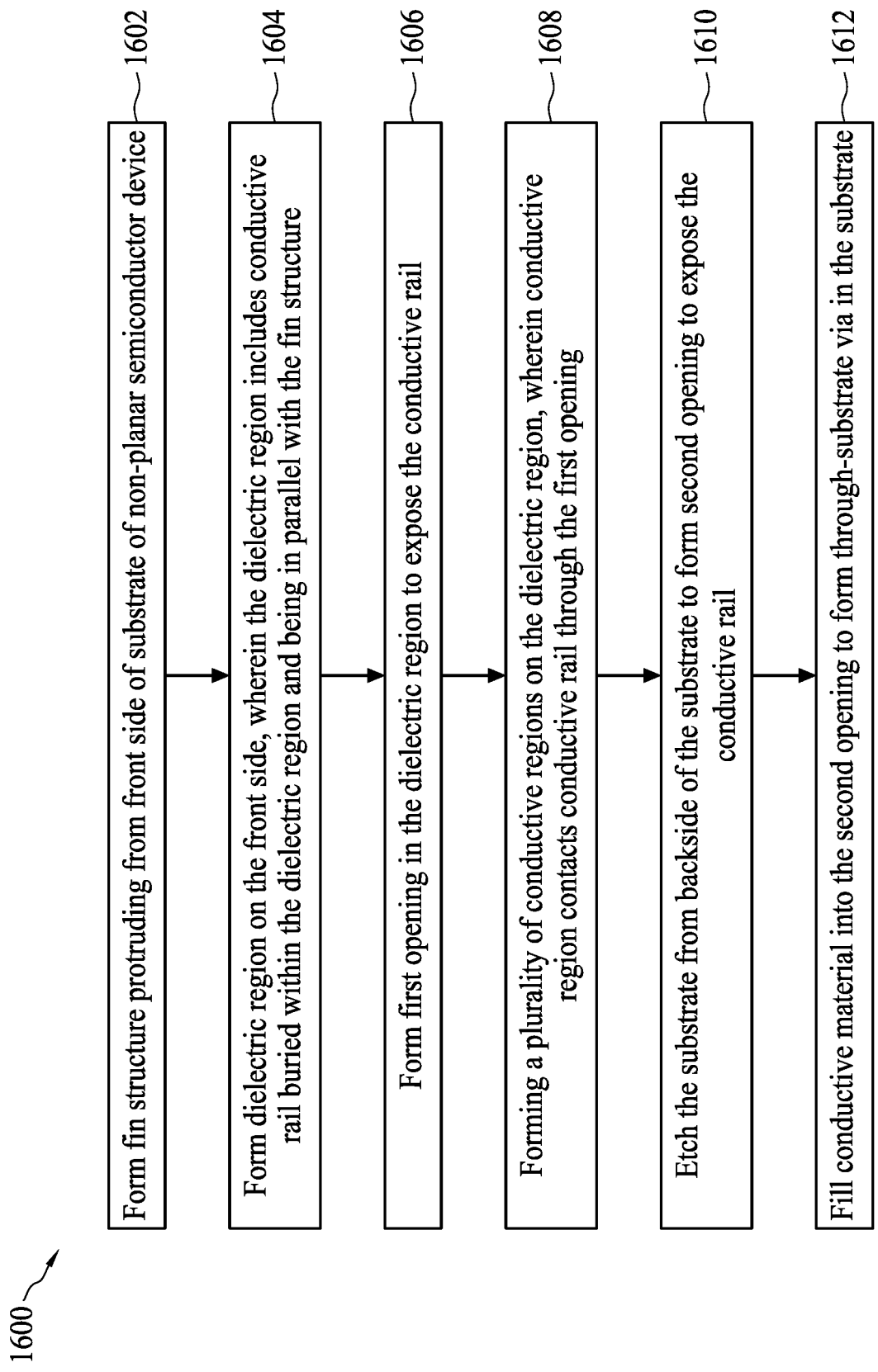
FIG. 16 is a flow chart of an exemplary method for forming a non-planar semiconductor device in accordance with some embodiments.

FIG. 16 is a flow chart of an exemplary method for forming a non-planar semiconductor device according to an exemplary embodiment of the present disclosure. Other operations in the method 1600 can be performed and operations of the method 1600 can be performed in a different order and/or vary.

At operation 1602, a fin structure is formed and protrudes from a front side of a substrate of the non-planar semiconductor device. For example, as described in FIG. 3, the fin structures 304 are formed and protrude from a front side of the substrate 302.

At operation 1604, a dielectric region is formed on the front side of the substrate, wherein the dielectric region comprises a conductive rail buried within the dielectric region and being in parallel with the fin structure. For example, as described in FIG. 5, the ILD 506 is formed on the substrate 302, and one or more conductive rails 502 are buried within the ILD 506 and parallel with the fin structures 304.

At operation 1606, a first opening is formed in the dielectric region to expose the conductive rail. For example, as described in FIG. 7, the trenches 702 are formed in the partially-etched ILD 602 to expose portions of one or more of the conductive rails 502 that are formed between adjacent poly gate structures 604. In another example, as described in FIG. 12, trenches are formed in the partially-etched ILD 1210 to expose portions of one or more of the conductive rails 1208 such as the conductive rails 1208A and 1208B.

At operation 1608, a plurality of conductive regions are formed on the dielectric region, wherein a first conductive region of the plurality of conductive regions contacting the conductive rail through the first opening. For example, as described in FIG. 7 and FIG. 8, the epitaxial source/drain terminals 802 are formed on the partially-etched ILD 602, and the epitaxial source/drain terminals 802A and 802B of the epitaxial source/drain terminals 802 connect to the conductive rail regions 502A and 502B, respectively. In another example, as described in FIG. 12, the gate structures 1216 are formed on the partially-etched ILD 1210, and arranged to connect to the conductive rails 1208A and 1208B, respectively.

At operation 1610, the substrate is etched from a backside thereof to form a second opening to expose the conductive rail. For example, as described in FIG. 14, the substrate 1402 is etched from a backside to expose one or more conductive rails 1208. In some embodiments, before etching the substrate 1402 from the backside, a thickness of the substrate 1402 can be reduced (e.g. by wafer grinding) to facilitate the etch process.

At operation 1612, a first conductive material is filled into the second opening to form a through-substrate via in the substrate. For example, as described in FIG. 14, conductive material(s) are filled into the opening(s) to form through-substrate vias penetrating the substrate 1402.

In some embodiments, after one or more through-substrate vias are formed in the substrate, a power grid conductor can be connected to the backside of the substrate to integrate a backside power scheme into the non-planar semiconductor device. Additionally, or alternatively, a metal pad can be formed onto the backside of the substrate to electrically connect the power grid conductor to the through-substrate via. For example, as described in FIG. 15, one or more power grid conductors 1524 of a power grid can be connected to the conductive structures 1404 (e.g. TSVs and/or TSTs). In some embodiments, as the conductive structures 1404 (e.g. TSVs and/or TSTs) can be electrically connected to one or more conductive rails 1208 which are electrically connected to one or more conductive regions (e.g. source, gate and/or drain regions), the one or more power grid conductors 1524 can be electrically connected to the one or more conductive regions on the front side of the substrate 1402.

In some embodiments, the method 1600 can include operation(s) to form metal wires with self-aligned vias on the front side of the substrate, such as the following operations: forming a dielectric layer on the plurality of conductive regions, the dielectric layer including a first metal wire extending in a first direction, the first metal wire being buried within the dielectric layer and electrically connected to one of the plurality of conductive regions; forming a trench in the dielectric layer to expose the first metal wire, the trench extending in a second direction different from the first direction; and depositing a second conductive material into the trench to form a conductive through via and a second metal wire, wherein the first metal wire is electrically connected to the second metal wire through the conductive through via.

For example, as described in FIG. 13, a dielectric layer (including the dielectric layer structure 1320 and the dielectric layers 1326) can be formed on the metal gate structures 1216 and the source/drain contacts 1218 (a plurality of conductive regions), wherein one or more metal wires 1324 are buried within the dielectric layer and extend in a first direction. The one or more metal wires 1324 can be electrically connected to conductive region(s). In the exemplary embodiment illustrated in FIG. 13, the metal wire 1324 can be electrically connected to a gate region including the metal gate structure 1216 through the conductive through via V0. Next, a trench can be formed in the dielectric layer to expose the metal wire 1324, wherein the trench extends in a second direction different from the first direction such that the metal wire 1324 and the dielectric layer structure 1320 are exposed. Conductive material(s) can be deposited into the trench to form a conductive through via and a metal wire, wherein the metal wire 1324 is electrically connected to the formed metal wire through the conductive through via. For example, in the exemplary embodiment illustrated in FIG. 13, one metal wire 1324 can be electrically connected to one metal wire 1328 through the conductive through via V1, and another metal wire 1324 can be electrically connected to another metal wire 1328 through the conductive through via V2.

Some embodiments described herein may include a semiconductor device. The semiconductor device includes a substrate, a dielectric region, a first fin structure, a second fin structure, a plurality of conductive regions, a first conductive rail and a conductive structure. The dielectric region is situated on the substrate. The first fin structure protrudes from the substrate and the dielectric region. The second fin structure protrudes from the substrate and the dielectric region, and extends parallel to the first fin structure. The conductive regions are situated on the dielectric region. The first conductive rail is situated within the dielectric region, and electrically connected to a first conductive region of the plurality of conductive regions. A first side of the first conductive rail faces the first fin structure, and a second side of the first conductive rail opposite to the first side faces the second fin structure. The conductive structure penetrates through the substrate and formed under the first conductive rail, and is electrically connected to the first conductive rail.

Some embodiments described herein may include an integrated circuit. The integrated circuit includes a substrate, a dielectric region, a first fin field-effect transistor, a conductive rail and a conductive structure. The dielectric region is situated on the substrate. The first fin field-effect transistor includes a first source region, a first gate region and a first drain region situated on the dielectric region. The conductive rail is situated within the dielectric region, and electrically connected to a first terminal region selected from among the first source region, the first gate region and the first drain region. The first terminal region overlaps with the conductive rail when viewed from a top of the substrate. The conductive structure penetrates through the substrate and formed under the conductive rail, and is electrically connected to the conductive rail.

Some embodiments described herein may include a semiconductor device. The semiconductor device includes a substrate, a dielectric region, a fin structure, a plurality of conductive regions, a first conductive rail and a conductive structure. The dielectric region is situated on the substrate. The fin structure protrudes from the substrate and the dielectric region. The conductive regions are situated on the dielectric region. The first conductive rail is situated within the dielectric region, and faces a sidewall of the fin structure. The conductive structure penetrates through the substrate and formed under the first conductive rail, and is electrically connected to a bottom surface of the first conductive rail and a bottom surface of the fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a dielectric region situated on the substrate;
a first fin structure protruding from the substrate and the dielectric region;
a second fin structure protruding from the substrate and the dielectric region, the second fin structure extending parallel to the first fin structure;
a plurality of conductive regions situated on the dielectric region;
a first conductive rail situated within the dielectric region, the first conductive rail being electrically connected to a first conductive region of the plurality of conductive regions, wherein a first side of the first conductive rail faces the first fin structure, and a second side of the first conductive rail opposite to the first side faces the second fin structure; the first conductive region is formed on the first fin structure, and extends beyond the second side of the first conductive rail; and
a conductive structure penetrating through the substrate and formed under the first conductive rail, the conductive structure being electrically connected to the first conductive rail.

2. The semiconductor device of claim 1, wherein the conductive structure comprises a conductive through-substrate via.

3. The semiconductor device of claim 1, further comprising:
a power grid conductor situated under the substrate, the power grid conductor being electrically connected to the conductive structure.

4. The semiconductor device of claim 3, further comprising:
a metal pad situated between the substrate and the power grid conductor, the metal pad configured to electrically connect the power grid conductor to the substrate.

5. The semiconductor device of claim 1, wherein a fin of the first fin structure contacts the conductive structure, while a fin of the second fin structure is separated from the conductive structure.

6. The semiconductor device of claim 1, further comprising:
a second conductive rail situated within the dielectric region, wherein the first conductive rail faces a first sidewall of the fin structure, and the second conductive rail faces a second sidewall of the fin structure.

7. The semiconductor device of claim 6, wherein the second conductive rail is electrically connected to the conductive structure, and electrically connected to the first conductive rail through the conductive structure.

8. The semiconductor device of claim 1, further comprising:
a first metal wire electrically connected to a second conductive region of the plurality of conductive regions, the first metal wire extending in a first direction;
a second metal wire extending in a second direction different from the first direction; and
a conductive through via located on the first metal wire and below the second metal wire, the first metal wire being electrically connected to the second metal wire through the conductive through via.

9. The semiconductor device of claim 8, wherein the second conductive region is electrically connected to the first conductive region through the first conductive rail, or is isolated from the first conductive rail by the dielectric region.

10. An integrated circuit, comprising:
a substrate;
a dielectric region situated on the substrate;
a first fin field-effect transistor, comprising a first source region, a first gate region and
a first drain region situated on the dielectric region;
a conductive rail situated within the dielectric region, the conductive rail being electrically connected to a first terminal region selected from among the first source region, the first gate region and the first drain region, wherein the first terminal region overlaps with the conductive rail when viewed from a top of the substrate; and a conductive structure penetrating through the substrate and formed under the conductive rail, the conductive structure being electrically connected to the conductive rail.

11. The integrated circuit of claim 10, wherein the first fin field-effect transistor further comprises a fin structure protruding from the substrate and the dielectric region and contacting the conductive structure.

12. The integrated circuit of claim 11, wherein a first side of the conductive rail faces a sidewall of the first fin structure, and a second side of the conductive rail faces away from the sidewall of the first fin structure; the first terminal region surrounds the fin structure, and the sidewall of the fin structure faces a side of the first terminal region; the first side of the conductive rail faces away from the side of the first terminal region, and the second side of the conductive rail faces the side of the first terminal region.

13. The integrated circuit of claim 10, the conductive structure comprises a conductive through-substrate via.

14. The integrated circuit of claim 10, further comprising:
a power grid conductor situated under the substrate, the power grid conductor being electrically connected to the conductive structure.

15. The integrated circuit of claim 14, further comprising:
a metal pad situated between the substrate and the power grid conductor, the metal pad configured to electrically connect the power grid conductor to the substrate.

16. The integrated circuit of claim 10, further comprising:
a second fin field-effect transistor, comprising a second source region, a second gate region and a second drain region situated on the dielectric region; and
a first metal wire electrically connected to a second conductive region selected from among the first source region, the first gate region, the first drain region, the second source region, the second gate region and the second drain region, the first metal wire extending in a first direction;

a second metal wire extending in a second direction different from the first direction; and
a conductive through via located on the first metal wire and below the second metal wire, the first metal wire being electrically connected to the second metal wire through the conductive through via.

17. A semiconductor device, comprising:
a substrate;
a dielectric region situated on the substrate;
a fin structure protruding from the substrate and the dielectric region;
a plurality of conductive regions situated on the dielectric region;
a first conductive rail situated within the dielectric region, the first conductive rail facing a sidewall of the fin structure; and
a conductive structure penetrating through the substrate and formed under the first conductive rail, the conductive structure being electrically connected to a bottom surface of the first conductive rail and in contact with a bottom surface of the fin structure.

18. The semiconductor device of claim 17, further comprising:
a power grid conductor situated under the substrate, the power grid conductor being electrically connected to the first conductive rail through the conductive structure.

19. The semiconductor device of claim 17, further comprising:
a conductive region situated on the dielectric region, wherein the conductive region is electrically connected to the first conductive rail, or is isolated from the first conductive rail by the dielectric region.

20. The semiconductor device of claim 17, further comprising:
a second conductive rail region situated within the dielectric region, the second conductive rail facing an opposite sidewall of the fin structure, wherein the conductive structure is electrically connected to a bottom surface of the second conductive rail.

* * * * *